(12) United States Patent
Tsai et al.

(10) Patent No.: US 12,300,563 B2
(45) Date of Patent: May 13, 2025

(54) SEMICONDUCTOR PACKAGE AND METHOD OF FABRICATING THE SAME

(71) Applicant: Taiwan Semiconductor Manufacturing Company, Ltd., Hsinchu (TW)

(72) Inventors: Hao-Yi Tsai, Hsinchu (TW); Tzuan-Horng Liu, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/161,814

(22) Filed: Jan. 30, 2023

(65) Prior Publication Data

US 2023/0170272 A1    Jun. 1, 2023

Related U.S. Application Data

(63) Continuation of application No. 17/199,374, filed on Mar. 11, 2021, now Pat. No. 11,594,460.

(51) Int. Cl.

| | |
|---|---|
| *H01L 23/04* | (2006.01) |
| *H01L 21/48* | (2006.01) |
| *H01L 21/56* | (2006.01) |
| *H01L 21/683* | (2006.01) |
| *H01L 21/78* | (2006.01) |
| *H01L 23/31* | (2006.01) |
| *H01L 23/34* | (2006.01) |
| *H01L 25/00* | (2006.01) |
| *H01L 21/768* | (2006.01) |
| *H01L 23/00* | (2006.01) |

(52) U.S. Cl.
CPC .......... *H01L 23/3185* (2013.01); *H01L 21/56* (2013.01); *H01L 21/6836* (2013.01); *H01L 21/78* (2013.01); *H01L 23/3135* (2013.01); *H01L 25/50* (2013.01); *H01L 21/76898* (2013.01); *H01L 24/08* (2013.01); *H01L 24/20* (2013.01); *H01L 24/32* (2013.01); *H01L 2221/68327* (2013.01); *H01L 2224/08145* (2013.01); *H01L 2224/211* (2013.01); *H01L 2224/32145* (2013.01)

(58) Field of Classification Search
CPC ....... H01L 25/0657; H01L 2224/32145; H01L 24/80; H01L 2224/0814
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| (Continued) | | |

*Primary Examiner* — Kyoung Lee
*Assistant Examiner* — David J Goodwin
(74) *Attorney, Agent, or Firm* — JCIPRNET

(57) ABSTRACT

A semiconductor package provided herein includes a first semiconductor die, a second semiconductor die and an insulating encapsulation. The second semiconductor die is stacked on the first semiconductor die. The insulating encapsulation laterally surrounds the first semiconductor die and the second semiconductor die in a one-piece form, and has a first sidewall and a second sidewall respectively adjacent to the first semiconductor die and the second semiconductor die. The first sidewall keeps a lateral distance from the second sidewall.

20 Claims, 46 Drawing Sheets

(56) References Cited

U.S. PATENT DOCUMENTS

| | | |
|---|---|---|
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2017/0207197 A1* | 7/2017 | Yu .......................... H01L 24/92 |
| 2019/0244947 A1* | 8/2019 | Yu .......................... H01L 24/92 |
| 2020/0135683 A1* | 4/2020 | Kim ....................... H01L 24/09 |

* cited by examiner

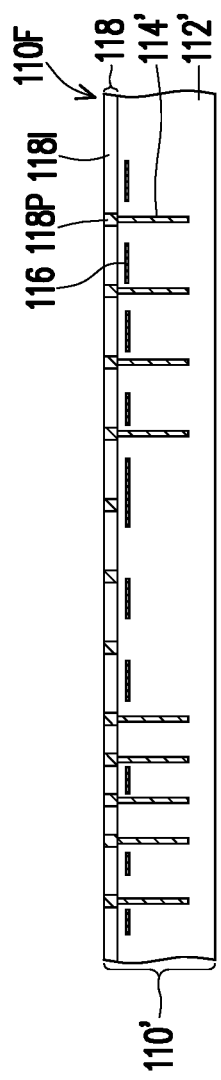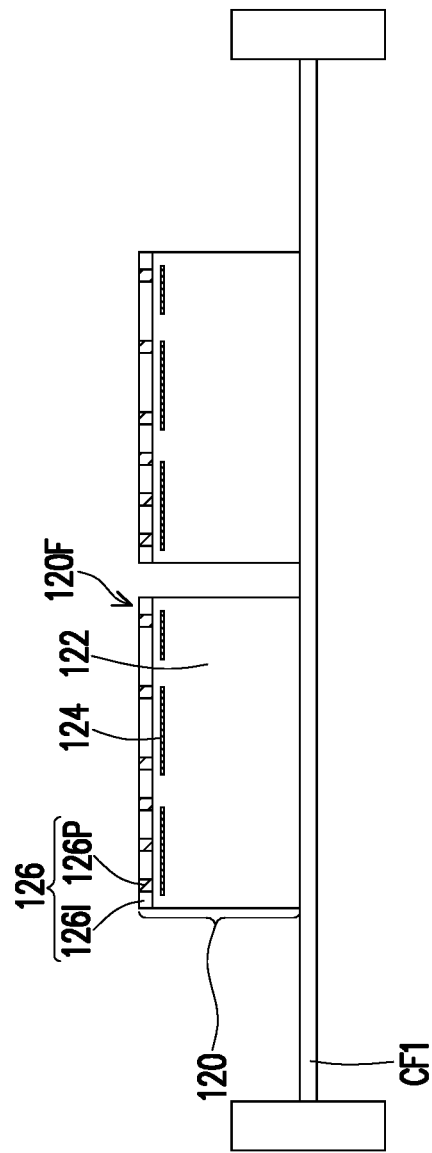

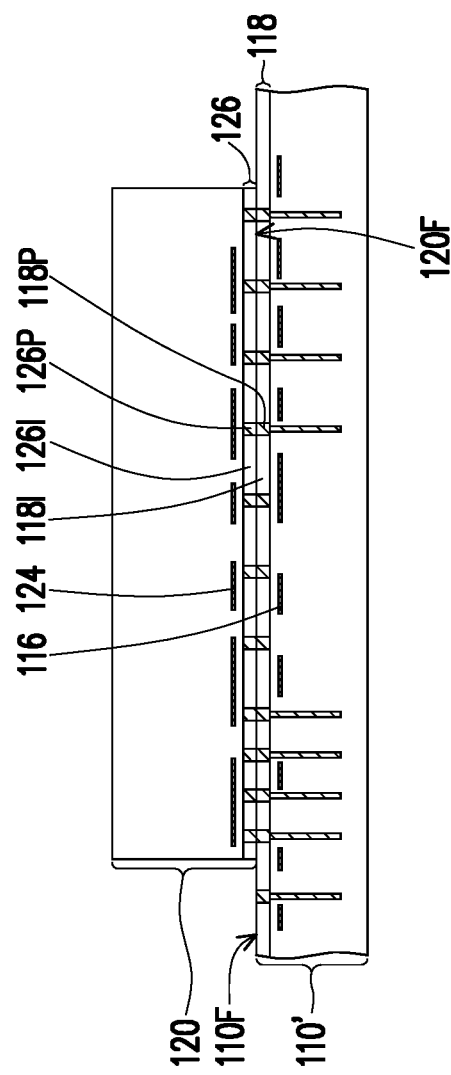

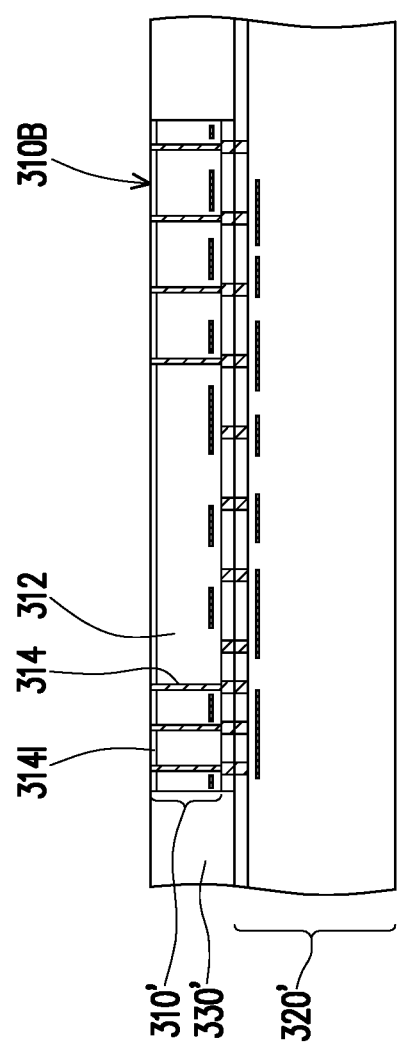

SEMICONDUCTOR PACKAGE AND METHOD OF FABRICATING THE SAME

CROSS-REFERENCE TO RELATED APPLICATION

This application is a continuation of and claims the benefit of a prior U.S. application Ser. No. 17/199,374, filed Mar. 11, 2021, now allowed. The entirety of the above-mentioned patent application is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies. Currently, System-on-Integrated-Circuit (SoIC) components are becoming increasingly popular for their multi-functions and compactness. However, there are challenges related to packaging process of the SoIC components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A through FIG. 1M are cross-sectional views schematically illustrating a process flow for fabricating a semiconductor package in accordance with some embodiments of the disclosure.

FIG. 3A to FIG. 3J are cross-sectional views schematically illustrating a method of fabricating a semiconductor package in accordance with some embodiments of the disclosure.

DETAILED DESCRIPTION

Figure 1D:
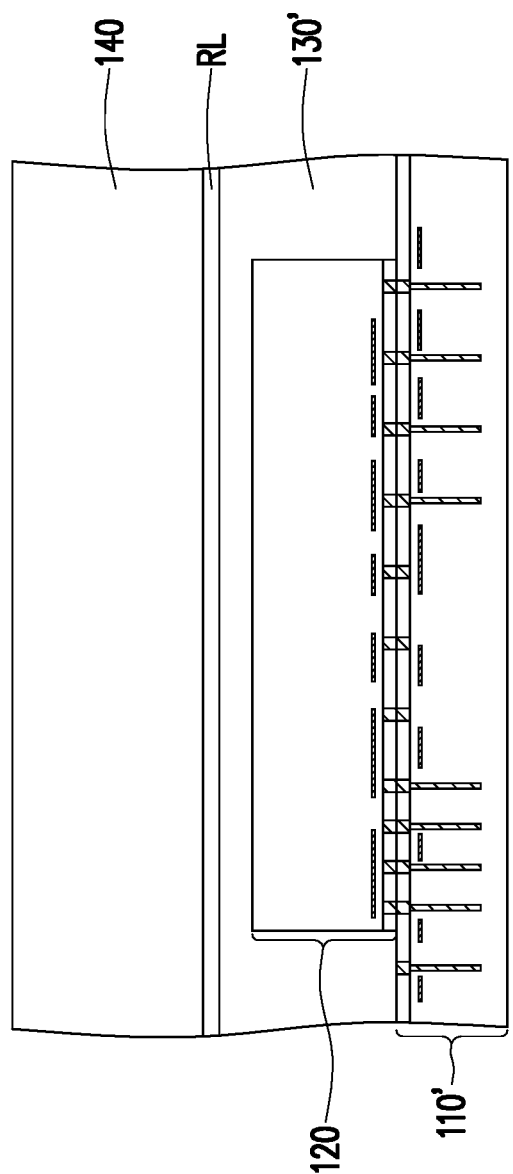

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1M are cross-sectional views schematically illustrating a process flow for fabricating a semiconductor package in accordance with some embodiments of the disclosure.

In FIG. 1A, a first semiconductor wafer 110' is provided and the first semiconductor wafer 110' includes a wafer substrate 112' with a through silicon via structures 114' and circuit components 116 formed there therein. The wafer substrate 112' may be a silicon wafer. The circuit components 116 include active components (e.g., transistors or the like) and passive components (e.g., resistors, capacitors, inductors, or the like) adjacent to a front side 110F of the first semiconductor wafer 110'. The active components and passive components are formed in the wafer substrate 112' through front end of line (FEOL) fabrication processes of a semiconductor wafer. The through silicon via structures 114' are formed in the first semiconductor wafer 110' and each extends from the surface adjacent to the front side 110F into a certain depth of the wafer substrate 112' without passing through the wafer substrate 112' in the thickness direction. In the following steps, at least one first semiconductor die would be formed from the first semiconductor wafer 110'.

In addition, an interconnect circuit structure 118 is formed at the front side 110F of the first semiconductor wafer 110'. The interconnect circuit structure 118 may be electrically connected to the through silicon via structures 114' and the circuit components 116, but the disclosure is not limited thereto. The interconnect circuit structure 118 may include interconnect wirings (e.g., copper interconnect wirings) and dielectric layer stacked alternately, wherein the interconnect wirings of the interconnect circuit structure 118 are electrically connected to the active components and/or the passive components in the wafer substrate 112'. The interconnect circuit structure 118 and the through silicon via structures 114' may be formed through back end of line (BEOL) fabrication processes of the semiconductor wafer. The outermost interconnect wirings in the interconnect circuit structure 118 may include conductive pads 118P surrounding by an insulation layer 118I, and the conductive pads 118P may be aluminum pads, copper pads, or other suitable metallic pads.

In FIG. 1B, a second semiconductor die 120 singulated and formed from a second semiconductor wafer (not shown) is provided and the second semiconductor die 120 is temporally carried by a carrier frame CF1. The second semiconductor die 120 may include a semiconductor substrate 122, such as a silicon substrate with circuit components 124 such as active components (e.g., transistors or the like) and passive components (e.g., resistors, capacitors, inductors, or the like) formed therein. The active components and passive components are formed in the second semiconductor wafer (not shown) through front end of line (FEOL) fabrication processes of the semiconductor wafer and may construct logic circuits, memory or a combination thereof.

An interconnect circuit structure 126 is formed on the semiconductor substrate 122 at a front side 120F of the second semiconductor die 120. The interconnect circuit structure 126 may include interconnect wirings (e.g., copper interconnect wirings) and dielectric layer stacked alternately, wherein the interconnect wirings of the interconnect circuit structure 126 are electrically connected to the circuit components 124 in the second semiconductor die 120. The interconnect circuit structure 126 is formed through back end of line (BEOL) fabrication processes of the semiconductor wafer. The outermost interconnect wirings in the interconnect circuit structure 126 may include conductive pads 126P surrounding by insulation layer 126I, and the conductive pads 126P may be aluminum pads, copper pads, or other suitable metallic pads.

In FIG. 1C, the second semiconductor die 120 is bonded onto the first semiconductor wafer 110' through a chip-on-wafer process. The front side 110F of the first semiconductor wafer 110' faces the front side 120F of the semiconductor die 120. As shown in FIG. 1C, the first semiconductor wafer 110' and the second semiconductor die 120 are oriented in a manner the side of the circuit components 124 facing the side of the circuit components 116. The first semiconductor wafer 110' and the second semiconductor die 120 may be bonded to each other through a hybrid-bonding process, such that there is no gap between the interconnect circuit structure 118 on the first semiconductor wafer 110' and the interconnect circuit structure 126 on the second semiconductor die 120. In some embodiments, the conductive pads 118P formed in the interconnect circuit structure 118 are in contact with the conductive pads 126P formed in the interconnect circuit structure 126, and the insulation layer 118I formed in the interconnect circuit structure 118 is in contact with the insulation layer 126I formed in the interconnect circuit structure 126. In FIG. 1C, the lateral dimension of the second semiconductor die 120 is smaller than the first semiconductor wafer 110' that is predetermined to divide into multiple semiconductor dies.

In FIG. 1D, a temporary glue material 130' is formed to the second semiconductor die 120. The temporary glue material 130' is formed on a carrier substrate 140 in advance so that the semiconductor wafer 110' and the second semiconductor die 120 are attached to the carrier substrate 140. An amount of the temporary glue material 130' is sufficient to completely fill the gap between the carrier substrate 140 and the first semiconductor wafer 110'. The temporary glue material 130' may laterally surround the second semiconductor die 120 and also extend between the second semiconductor die 120 and the carrier substrate 140. In some embodiments, the carrier substrate 140 is bonded onto the first semiconductor wafer 110' through a thermal pressing process in a wafer form to wafer form manner.

The temporary glue material 130' is a glue material capable of being removed in the subsequent steps. The temporary glue material 130' is solidified for bonding carrier substrate 140 onto the first semiconductor wafer 110'. The temporary glue material 130' has sufficient mechanical property without leaking, deforming, and/or damaging in the subsequent steps. In some embodiments, the temporary glue material 130' may be removed using a suitable cleaner such as a neutral detergent/cleaner so that the removing of the temporary glue material 130' in the subsequent steps would not damage other components or materials. The carrier substrate 140 may be a glass substrate having sufficient support property and rigidity to support and maintain the semiconductor wafer 110' and the second semiconductor die 120 in the subsequent processes. In some embodiments, the carrier substrate 140 may include a releasing layer RL formed thereon. The releasing layer RL is formed between the temporary glue material 130' and the glass substrate of the carrier substrate 140 so that the carrier substrate 140 is removable from the temporary glue material 130' in the subsequent process.

Figure 1E:
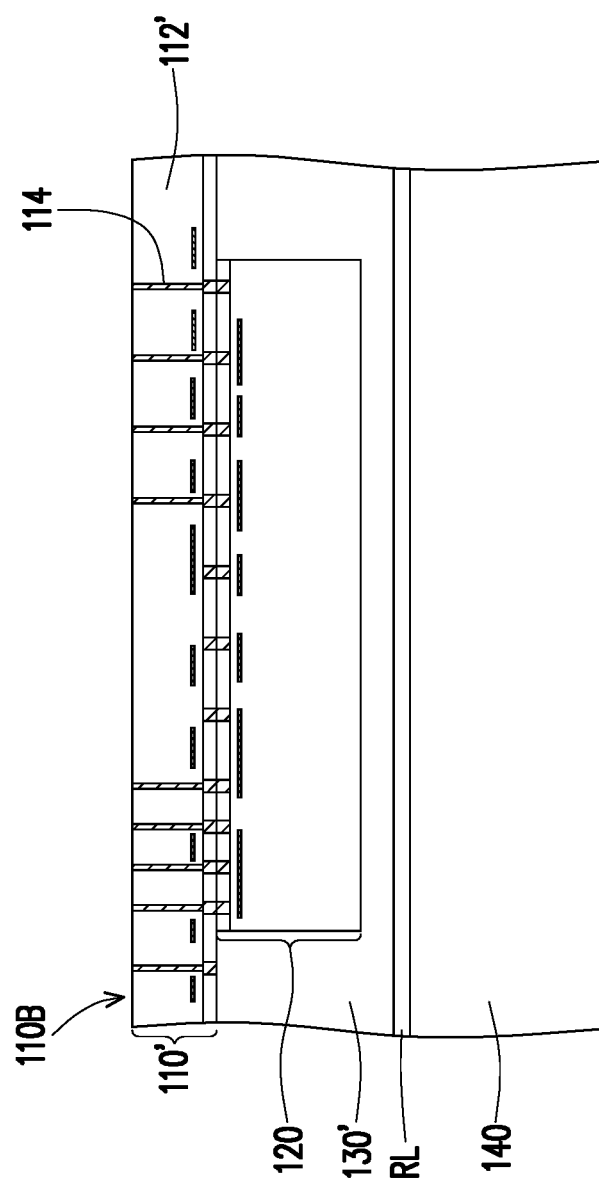

In FIG. 1E, the structure shown in FIG. 1D is oriented upside down and a reveal process of through substrate via is performed to form the through silicon vias 114. In the revealing process, the wafer substrate 112' of the first semiconductor wafer 110' is thinned until the through silicon via structures 114' is expose to form the through silicon vias 114 at the back side 110B of the first semiconductor wafer 110'. In some embodiments, a dielectric layer such as a silicon nitride layer may be formed at the back side 110B of the first semiconductor wafer 110' to laterally surround the exposed through silicon vias 114 and the tops of the through silicon vias 114 are revealed without being covered by the dielectric layer. In some embodiments, a grinding process may be performed to remove the dielectric material on the through silicon vias 114 so as to reveal the through silicon vias 114.

The through silicon vias 114 may have a length smaller than the through silicon via structures 114' shown in the previous drawings, but the disclosure is not limited thereto. In the revealing process, the second semiconductor die 120 is sealed by the temporary glue material 130' between the semiconductor wafer 110' and the carrier substrate 140, and the semiconductor wafer 110' and the second semiconductor die 120 are supported by the carrier substrate. The second semiconductor die 120 would not be damaged during the revealing process.

Figure 1F:
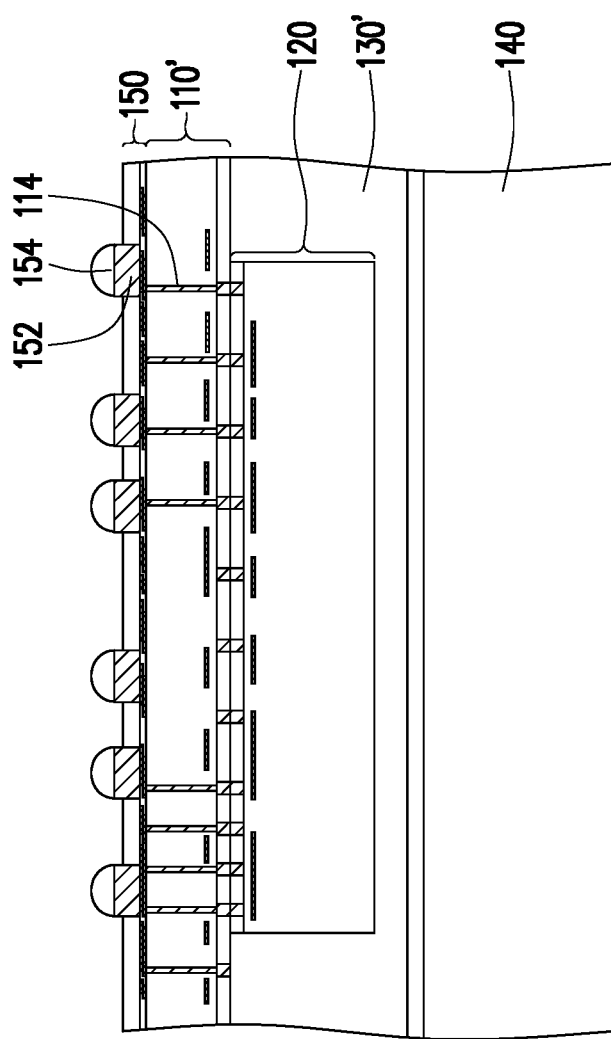

In FIG. 1F, an interconnect circuit structure 150 is formed at the back side 110B of the first semiconductor wafer 110'. The interconnect circuit structure 150 may include interconnect wiring layers (e.g., copper interconnect wirings) and dielectric layer stacked alternately. The interconnect wirings of the interconnect circuit structure 150 are electrically connected to the through silicon vias 114 formed in the first semiconductor wafer 110'. In addition, the outermost wiring layer of the interconnect circuit structure 150 includes a conductive feature 152 and a cap material 154 is optionally formed on top of the conductive feature 152. The conductive feature 152 may be a cupper via, a liner cupper via, or the like. In some embodiments, the conductive feature 152 is formed of a metal material such as cupper. The cap material 154 is formed by using a solder material. The conductive feature 152 with the cap material 154 on top serves as a testing pad for an electric test. For example, a wafer-level chip probing process may be performed on the semiconductor dies in the first semiconductor wafer 110' using the conductive feature 152 with the cap material 154, such that tested and reliable known good dies (KGDs) may be recognized. In some embodiments, the conductive feature 152 may not be covered by the cap material 154 and the wafer-level chip probing process may be performed on the conductive feature 152 directly.

Figure 1G:
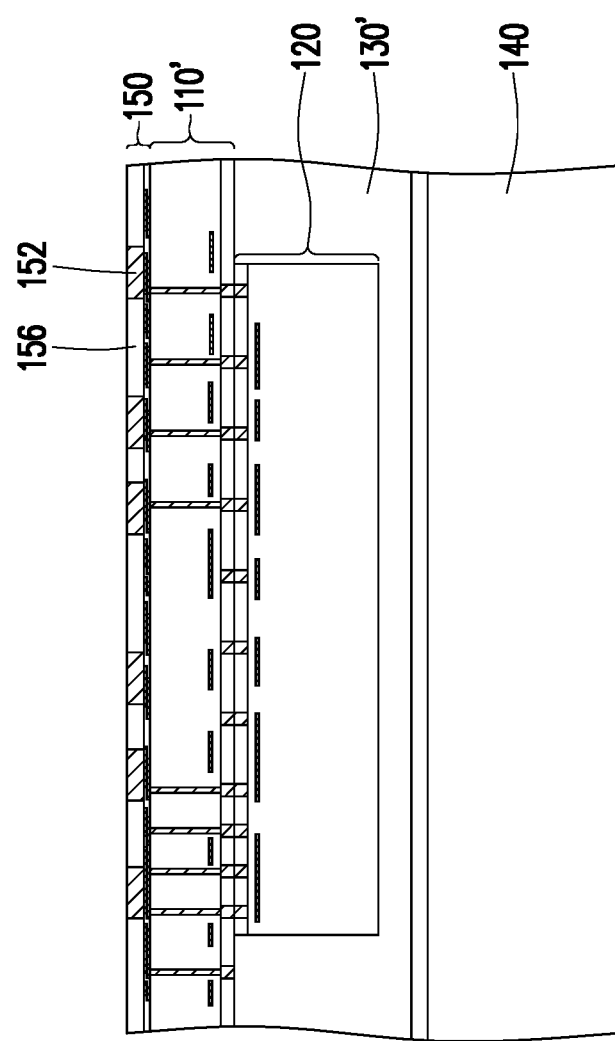

After performing the wafer-level chip probing process, the cap material 154 is removed. In some embodiments, the cap material 154 is removed from the top surfaces of the conductive feature 152 through an etching process, and a dielectric layer 156 is formed to laterally surround the conductive feature 152 as shown in FIG. 1G. A material of the dielectric layer 156 may include polyimide, for example, low temperature polyimide, high temperature polyimide or the like. The dielectric layer 156 is formed with a sufficient thickness to compensate the staggered surface caused by the protruding conductive feature 152 and serves as a planarization layer. In some embodiments, the dielectric layer 156 may cover the top of the conductive feature 152. In some alternative embodiments, the dielectric layer 156 may be leveled with the top of the conductive feature 152.

Figure 1H:
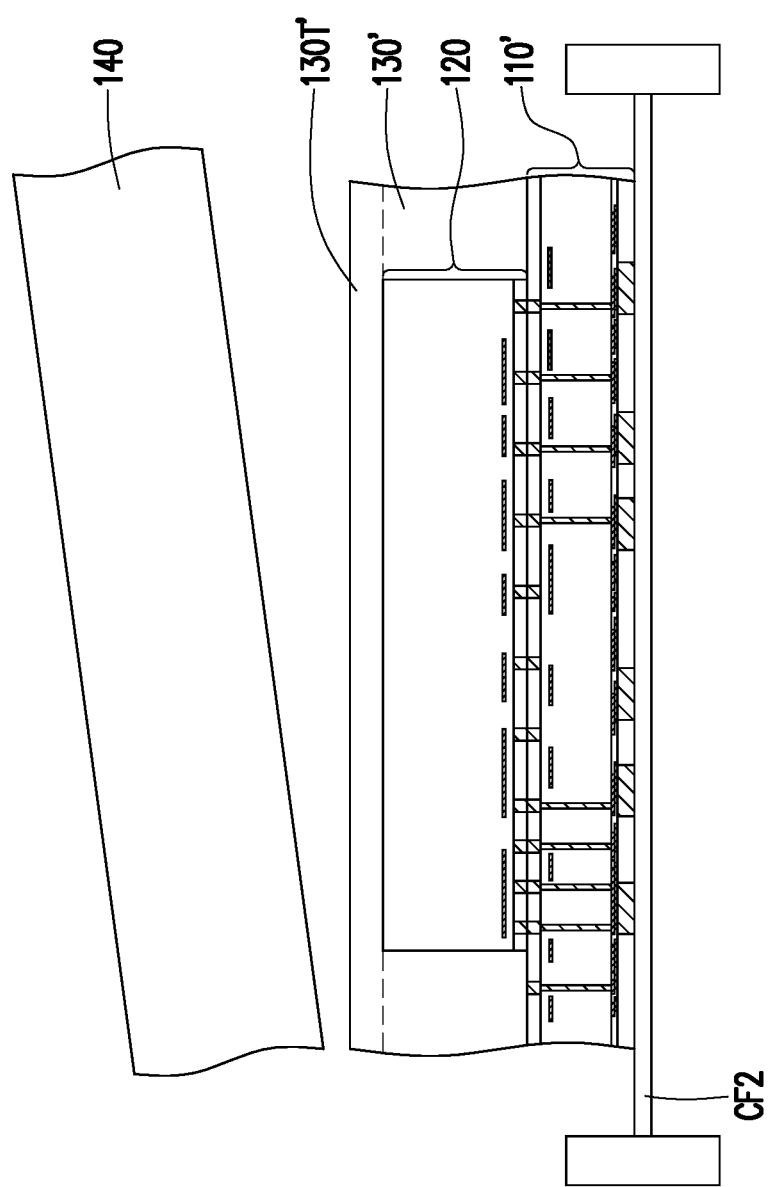

In FIG. 1H, the structure of FIG. 1G is oriented upside down and placed on a carrier frame CF2. In addition, the carrier substrate 140 is removed from the temporary glue material 130'. In some embodiments, the carrier substrate 140 is removed by performing a laser irradiation which causes the decomposition of the releasing layer on the carrier substrate 140 so that the carrier substrate 140 is easily separated from the temporary glue material 130'. In some embodiments, the carrier substrate 140 may involve less adhesion to the temporary glue material 130' than the first semiconductor wafer 110' and the second semiconductor die 120 so that the carrier substrate 140 is separable from the temporary glue material 130' without removing the temporary glue material 130' from the first semiconductor wafer 110'.

Figure 1I:
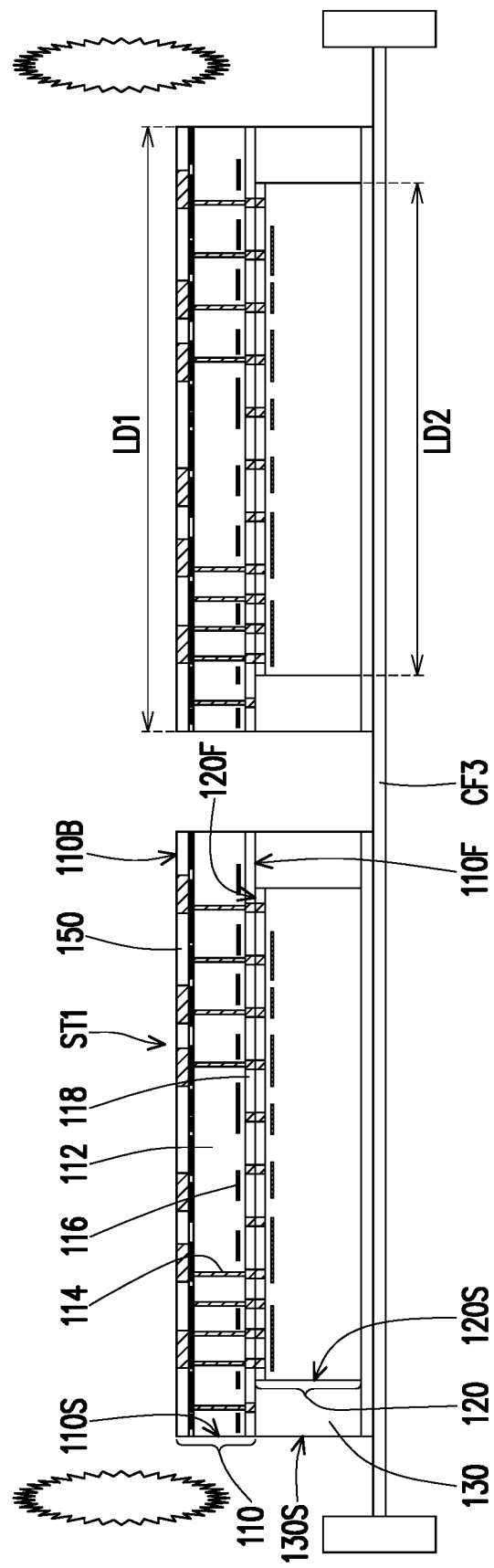

Subsequent to separating the carrier substrate 140 from the temporary glue material 130', the portion 130T' of the temporary glue material 130' over the second semiconductor die 120 is removed to expose the second semiconductor die 120 through a grinding process or buffering process, for example. In addition, the structure is oriented upside down and placed on another carrier frame CF3 and a singulation process is performed to obtain a singulated first semiconductor die 110 as shown in FIG. 1I.

The first semiconductor die 110 is formed from the first semiconductor wafer 110' in FIG. 1H through a singulation process such as a die saw process. In FIG. 1I, the wafer substrate 112' of the first semiconductor wafer 110' is cut to form a semiconductor substrate 112 with the through silicon vias 114 and the circuit components 116 formed therein. Each through silicon via 114 passes through the semiconductor substrate 112 in the thickness direction, the circuit components 116 is formed at the front side 110F, and the interconnect circuit structure 118 and the interconnect circuit structure 150 are respectively formed at the back side 110B and the front side 110A, which construct the first semiconductor die 110. The semiconductor substrate 112, the interconnect circuit structure 118 and the interconnect circuit structure 150 are exposed at the sidewall 110S of the first semiconductor die 110.

The first semiconductor die 110 and the second conductor die 120 are stacked with each other in a front side to front side orientation. In other words, the front side 120F of the second semiconductor die 120 faces the front side 110F of the first semiconductor die 110. The first semiconductor die 110 has a larger lateral dimension LD1 than the lateral dimension LD2 of the second semiconductor die 120 to construct a stair structure ST1. The sidewall 120S of the second semiconductor die 120 keeps a lateral distance from the sidewall 110S of the first semiconductor die 110. The temporary glue material 130' is cut to form a lateral fill 130 beside the second semiconductor die 120. The lateral fill 130 extends from the sidewall 120S to the sidewall 110S to compensate the difference of lateral dimensions between the first semiconductor die 110 and the second semiconductor die 120. In some embodiments, the sidewall 130S of the temporary glue material 130 is aligned with the sidewall 110S of the first semiconductor die 110 in a smooth or straight linear path since the sidewall 130S of the lateral fill 130 and the sidewall 110S of the first semiconductor die 110 are formed by the same sawing process. In addition, the lateral fill 130 though is able to be removed in the subsequent steps, is solid in the structure without deforming.

Figure 1J:
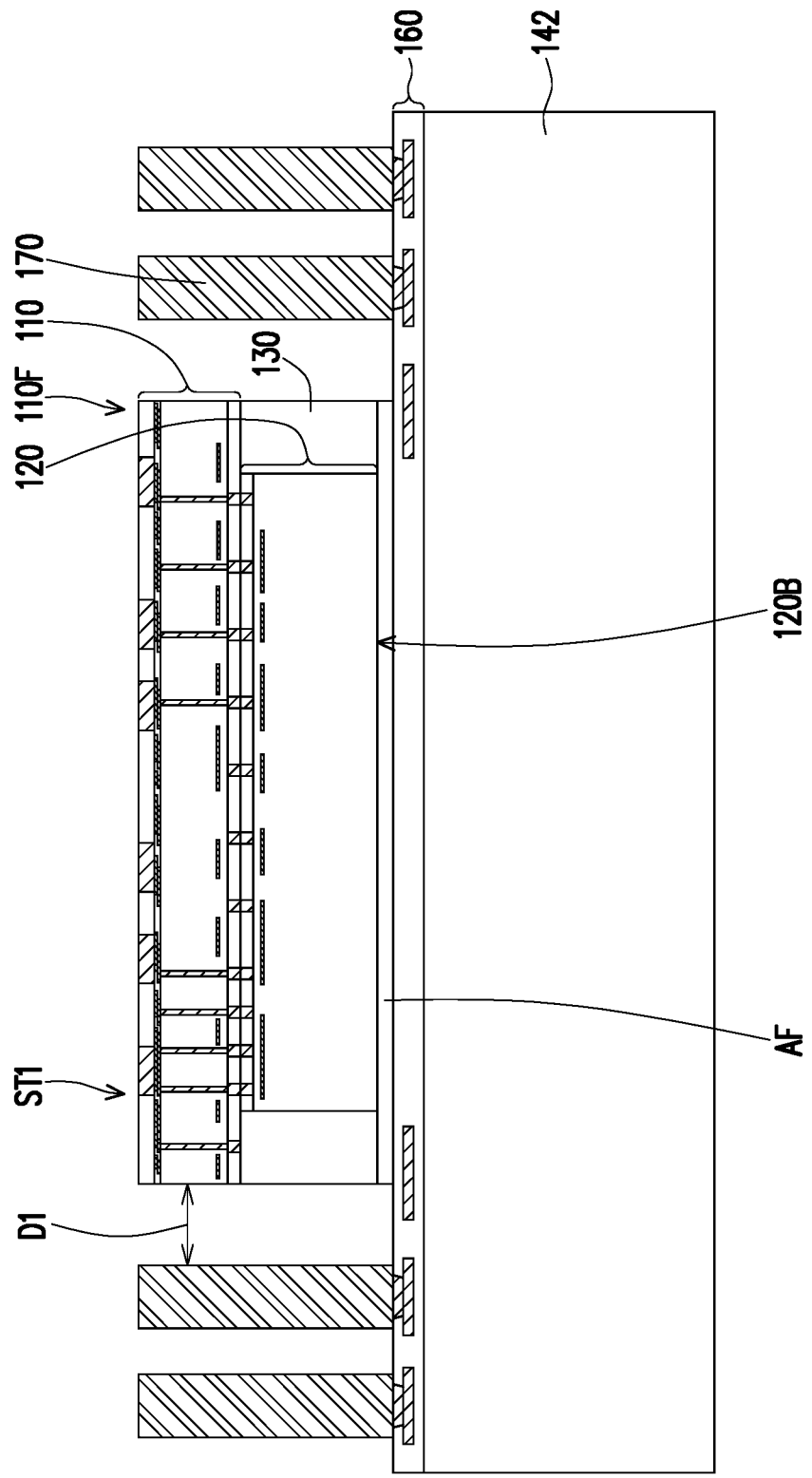

The stair structure ST1 with the lateral fill 130 is picked and placed on a carrier substrate 142 as shown in FIG. 1J. The second semiconductor die 120 is positioned between the carrier substrate 142 and the first semiconductor die 110 and is attached to the carrier substrate 142 with a die attach film AF. In some embodiments, the carrier substrate 142 is a glass substrate with a redistribution circuit structure 160 formed thereon and the second semiconductor die 120 is attached to the redistribution circuit structure 160 through the die attach film AF. The redistribution circuit structure 160 may include at least one conductive wiring layer and at least one dielectric layer stacked alternately. In addition, prior to attaching the stair structure ST1 with the temporary glue material 130 onto the carrier substrate 142, one or more through insulation via 170 is formed on the carrier substrate 142. The through insulation via 170 is a conductive pillar structure and electrically connected to the conductive wiring layer in the redistribution circuit structure 160. The through insulation via 170 is located around the stair structure ST1 and keeps a lateral distance D1 from the stair structure ST1.

As shown in FIG. 1J, the first semiconductor die 110 has a larger lateral dimension than the second semiconductor die 120 and a portion of the first semiconductor die 110 laterally exceeds the second semiconductor die 120. The lateral fill 130 overlaps the exceeding portion of the first semiconductor die 110 to compensate the difference on lateral dimensions between the first semiconductor die 110 and the second semiconductor die 120. The first semiconductor die 110 is oriented in a manner the back side 110B facing upward and the second conductor die 120 is oriented in a manner the back side 120B facing downward in FIG. 1J. The redistribution circuit structure 160 is located at the back side 120B of the second semiconductor die 120. The second semiconductor die 120 is attached onto the redistribution circuit structure 160 through the die attach film AF without forming an electric transmission path to pass through the back side 120B of the second semiconductor die 120, but the disclosure is not limited thereto.

Figure 1K:
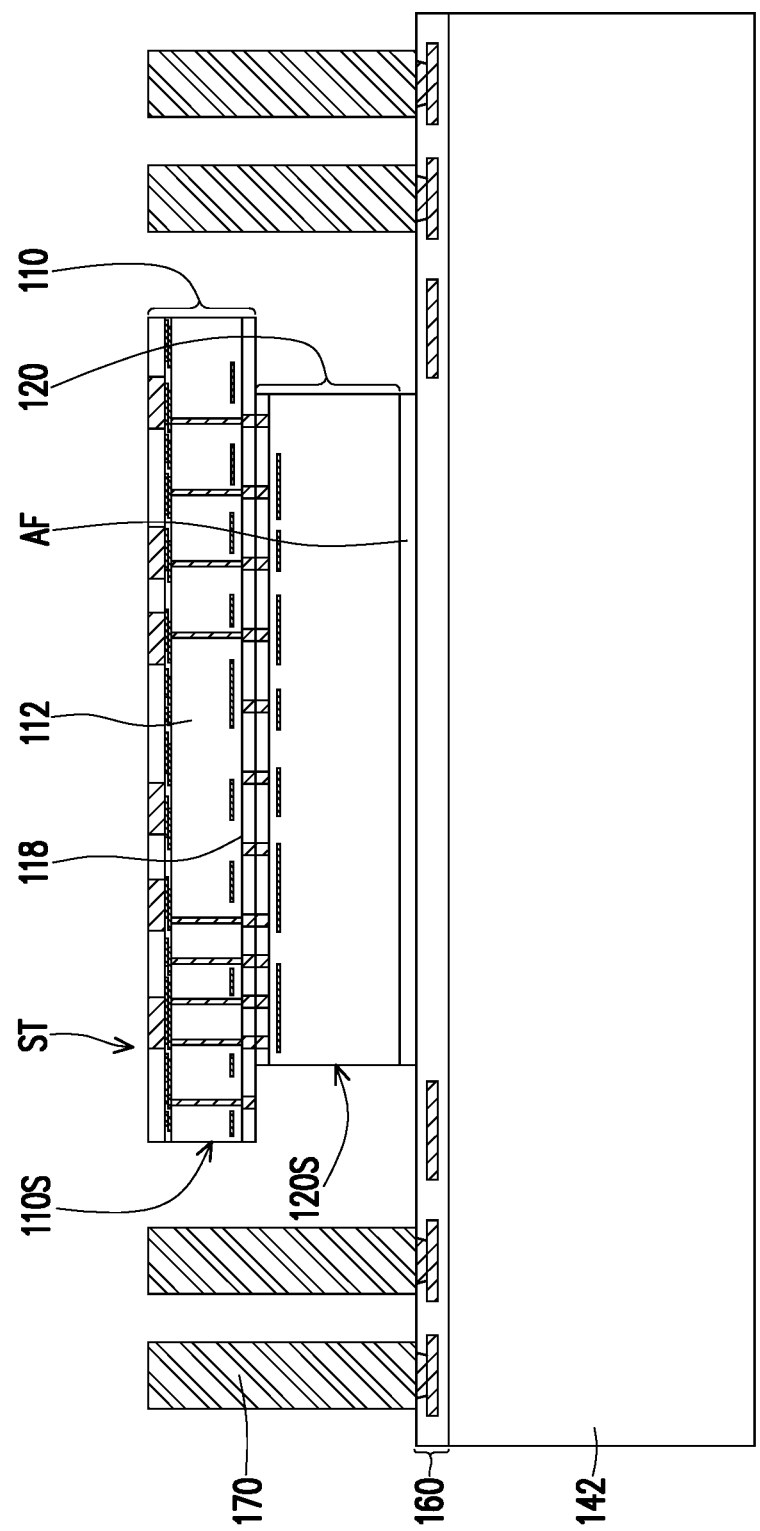

In FIG. 1K, a clean process is performed to remove the lateral fill 130 from the stair structure ST1. A neutral detergent/cleaner is used to solve/clean the material of the lateral fill 130 without damaging the other components such as the first semiconductor die 110, the second semiconductor die 120, the redistribution circuit structure 160 and the through insulation via 170. The sidewall 110S of the first semiconductor die 110 and the sidewall 120S of the second semiconductor die 120 are exposed without being covered after removing the lateral fill 130.

Figure 1L:
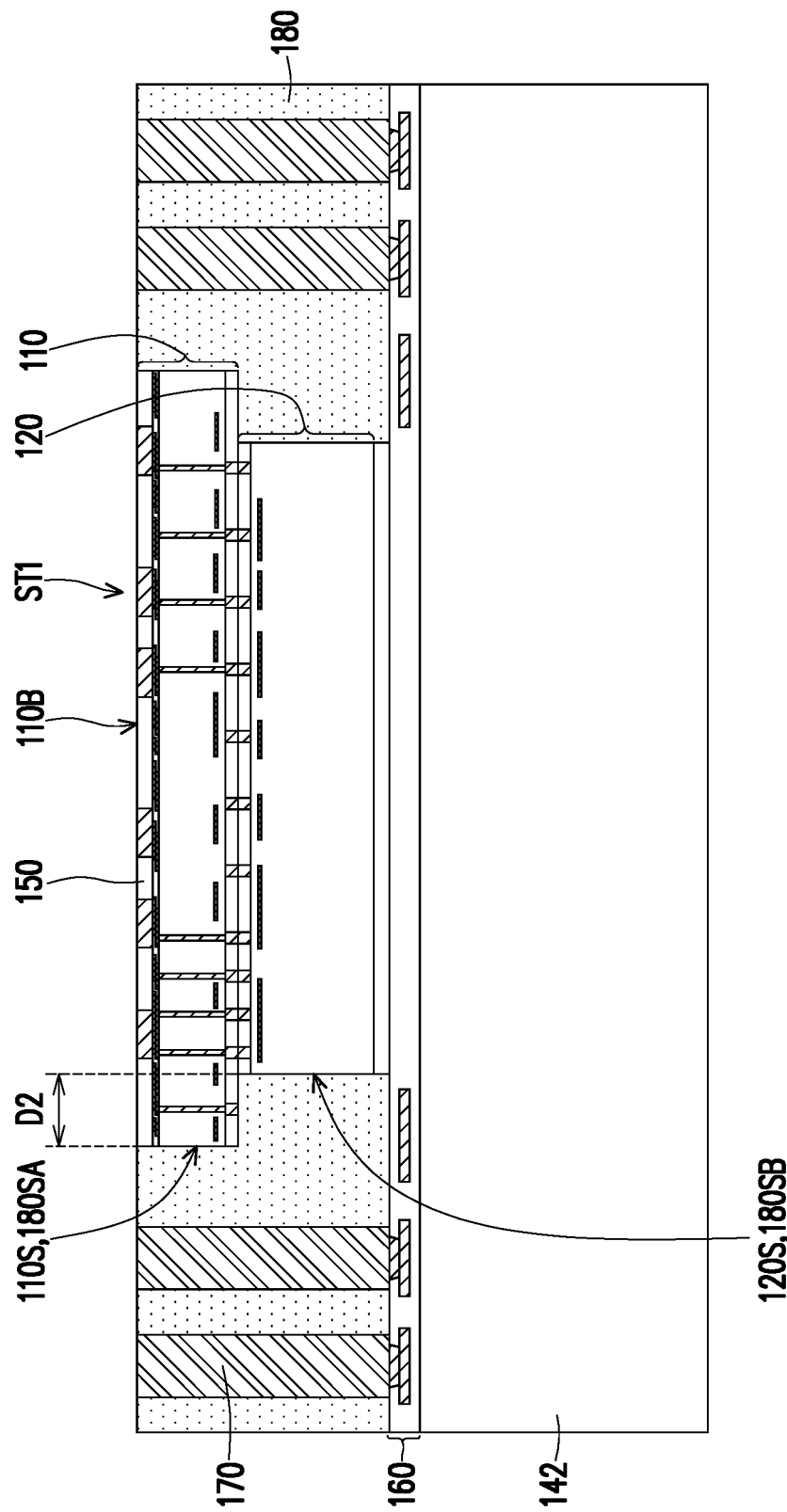

In FIG. 1L, an insulating encapsulation 180 is formed on the carrier substrate 142 and laterally encapsulates and seals the stair structure ST1. The insulating encapsulation 180 fills the gap between the stair structure ST1 and the through insulation via 170. The insulating encapsulation 180 includes a polymer material, in accordance with some embodiments. The insulating encapsulation 180 is formed using a molding process, in accordance with some embodiments. In some embodiments, a portion of the insulating encapsulation 180 may cover over the stair structure ST1 and a removal process of the insulating encapsulation 180 is performed, in accordance with some embodiments. The removal process includes a grinding process or a chemical mechanical polishing process, in accordance with some embodiments. The removal process is performed until exposing the through insulation via 170 and the interconnect circuit structure 150 so that the through insulation via 170 extends through the insulating encapsulation 180 in the thickness direction. The insulating encapsulation 180 laterally surrounds the stair structure ST1 and exposes the interconnect circuit structure 150 at the back side 110B of the first semiconductor die 110. In some embodiments, the interconnect circuit structure 150 of the first semiconductor die 110, the insulating encapsulation 180 and the through insulation via 170 are coplanar at the back side 110B of the first semiconductor die 110.

The insulating encapsulation 180 has a first sidewall 180SA and a second sidewall 180SB. The insulating encapsulation 180 is in direct contact with the first semiconductor die 110 at the first sidewall 180SA and in direct contact with the second semiconductor die 120 at the second sidewall 180SB. The sidewall 110S of the first semiconductor die 110 may coincide with the first sidewall 180SA of the insulating encapsulation 180. The sidewall 120S of the second semiconductor die 120 may coincide with the second sidewall 180SB of the insulating encapsulation 180. The first sidewall 180SA keeps a lateral distance D2 from the second sidewall 180SB and similarly, the sidewall 110S keeps the lateral distance D2 from the sidewall 120S. The lateral distance D2 may be corresponding to the dimension difference between the first semiconductor die 110 and the second semiconductor die 120.

Figure 1M:
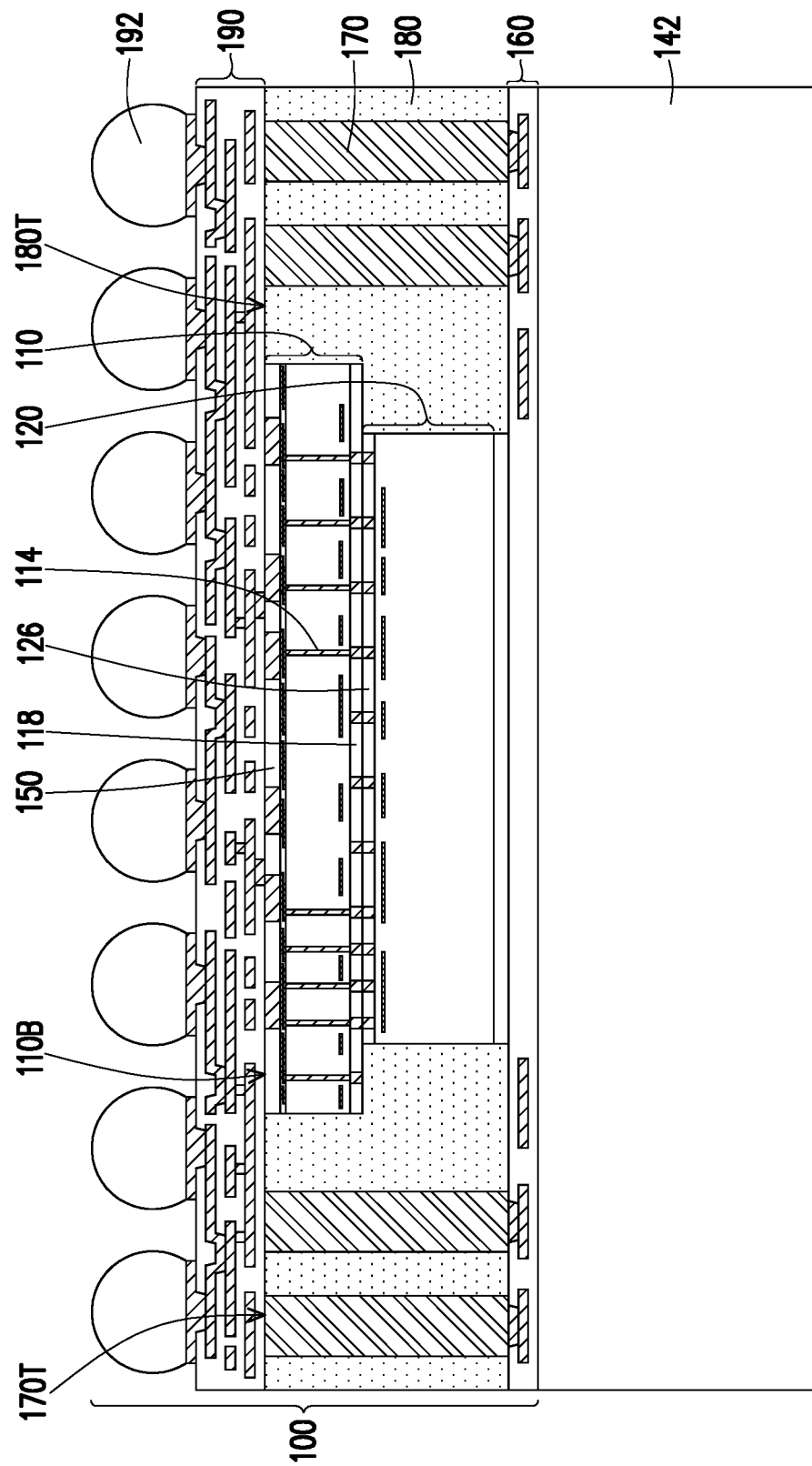

In FIG. 1M, another redistribution circuit structure 190 is formed on the stair structure ST1, the through insulation via 170 and the insulating encapsulation 180. The redistribution circuit structure 190 may include at least one conductive wiring layer and at least one dielectric layer stacked alternately. In some embodiments, the backside 110B of the first semiconductor die 110 in the stair structure ST1, the terminal surface 170T of the through insulation via 170 and the surface 180T of the insulating encapsulation 180 may be coplanar by performing planarization process such as a CMP process, or a grinding process. Therefore, the redistribution circuit structure 190 is formed on a substantially flat surface, which facilitates to ensure the yield of the redistribution circuit structure 190.

The redistribution circuit structure 190 is electrically connected to the through insulation via 170 and the first semiconductor die 110. In addition, the first semiconductor die 110 is electrically connected to the second semiconductor die 120 through the hybrid-bonding structure between the interconnect circuit structure 118 formed in the first semiconductor die 110 and the interconnect circuit structure 126 formed in the second semiconductor die 120, and the interconnect circuit structure 118 is electrically connected to the interconnect circuit structure 150 through the through silicon via 114 formed in the first semiconductor die 110. Accordingly, the redistribution circuit structure 190 is electrically connected to the second semiconductor die 120 through the first semiconductor die 110.

In FIG. 1M, a conductive terminal 192 is further formed on the redistribution circuit structure 190 to form a semiconductor package 100. The conductive terminal 192 may be a solder ball formed on a side of the redistribution circuit structure 190 away from the insulating encapsulation 180. The conductive terminal 192 is electrically to a conductive pad/layer formed in the redistribution circuit structure 190 and used for electrically connecting to an external device. In some embodiments, the carrier substrate 142 may be removed from the semiconductor package 100 after the redistribution circuit structure 190 and the conductive terminal 192 are formed.

Figure 1N:
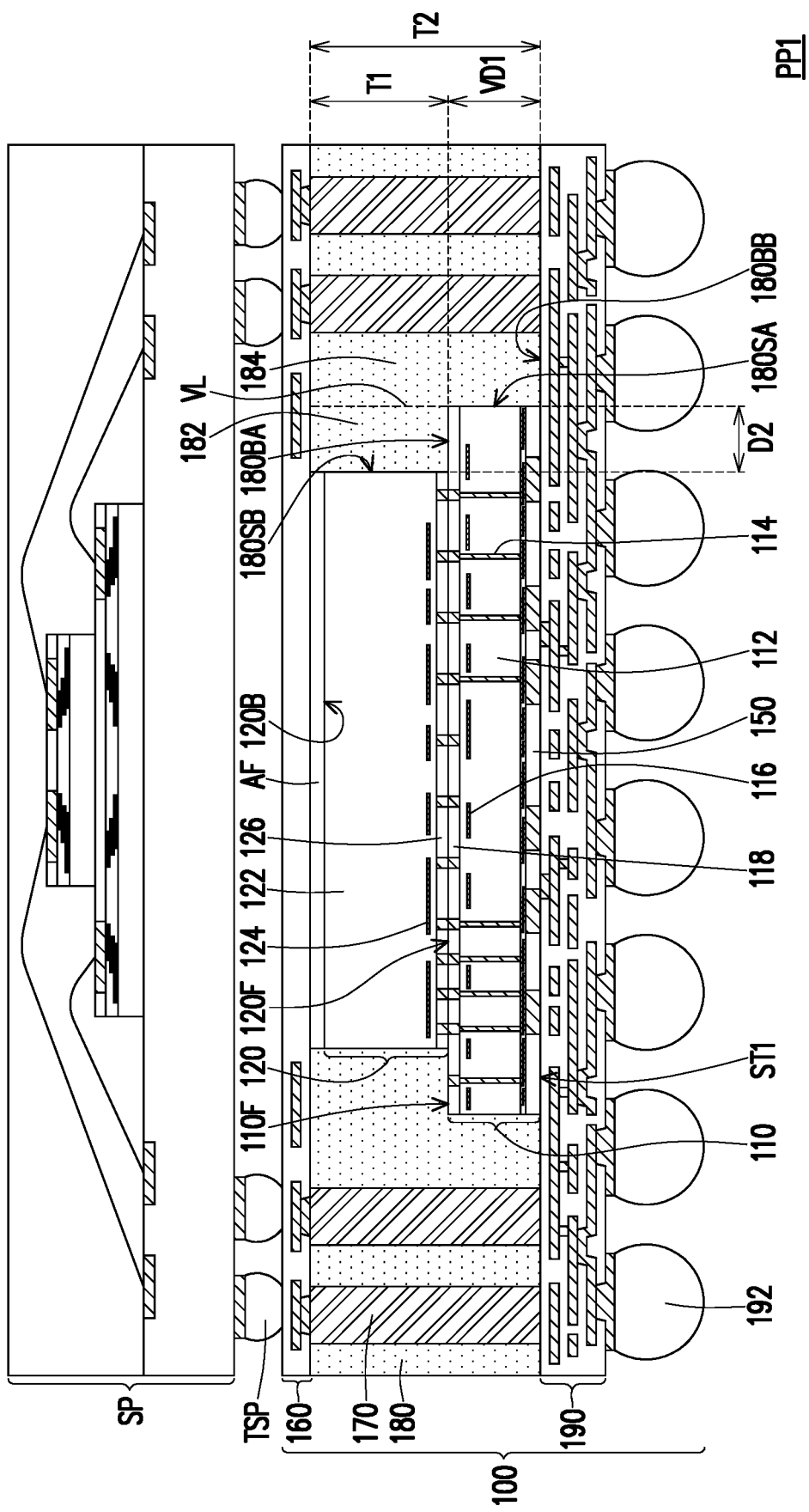
FIG. 1N schematically illustrates a package structure in accordance with some embodiments of the disclosure.

FIG. 1N schematically illustrate a package structure in accordance with some embodiments of the disclosure. The semiconductor package 100 is separated from the carrier substrate 142 (shown in FIG. 1M) and connected to another semiconductor package SP to construct a package structure PP1. The package structure PP1 is a package-on-package (PoP) structure which includes two or more semiconductor packages stacking with one another. A conductive terminal TSP is provided at a side of the semiconductor package SP and bonded onto the semiconductor package 100. In some embodiments, the conductive terminal TSP includes solder balls. The conductive terminal TSP may be bonded on the redistribution circuit structure 160 of the semiconductor package 100. The conductive terminal TSP and the conductive terminal 192 are located at opposite sides of the semiconductor package 100. In some embodiments, the semiconductor package SP may be a DRAM package, and the semiconductor package 100 may be a logic package, but the disclosure is not limited thereto.

The semiconductor package 100 includes a first semiconductor die 110, a second semiconductor die 120, a redistribution circuit structure 160, a through insulation via 170, an insulating encapsulation 180 and a redistribution circuit structure 190. The second semiconductor die 120 stacks with the first semiconductor 110 in the thickness direction. The through insulation via 170 is located around the stack of the first semiconductor die 110 and the second semiconductor die 120. The insulating encapsulation 180 laterally surround the first semiconductor die 110 and the second semiconductor die 120 in a one-piece form and also surround the through insulation via 170. The redistribution circuit structure 160 and the redistribution circuit structure 190 are disposed at opposite sides of the insulating encapsulation 180. The insulating encapsulation 180 is positioned between the redistribution circuit structure 160 and the redistribution circuit structure 160 in the thickness direction.

The first semiconductor die 110 includes the semiconductor substrate 112, the circuit components 116, the through silicon vias 114, the interconnect circuit structure 118 and the interconnect circuit structure 150. The semiconductor substrate 112 is, for example, a silicon substrate. The circuit components 116 are formed on/in the semiconductor substrate 112 through FEOL adjacent to the front side 110F of the first semiconductor die 110 and may include active circuit components and/or passive components. In some embodiments, the semiconductor substrate 112 of the first semiconductor die 110 may optionally not include the circuit components 116. The through silicon vias 114 are conductive pillars that penetrate through the semiconductor substrate 112. The interconnect circuit structure 118 and the interconnect circuit structure 150 are disposed at opposite sides of the semiconductor substrate 112. The through silicon vias 114 are connected physically and electrically between the interconnect circuit structure 118 and the interconnect circuit structure 150. In addition, the interconnect circuit structure 114 is connected to the second semiconductor die 120 through a hybrid-bonding structure at the front side 110F of the first semiconductor die 110, and the interconnect circuit structure 150 is connected physically and electrically to the redistribution circuit structure 190 at the back side 110B of the first semiconductor die 110.

The second semiconductor die 120 includes the semiconductor substrate 122, the circuit components 124 and the interconnect circuit structure 126. The semiconductor substrate 122 is a silicon substrate in some embodiments. The circuit components 124 are formed on/in the semiconductor substrate 122 adjacent to the front side 120F of the second semiconductor die 120. The interconnect circuit structure 126 is disposed at the front side 120F of the second semiconductor die 120 and electrically connected to the circuit components 124. The second semiconductor die 120 is attached to the redistribution circuit structure 160 at the back side 120B of the second semiconductor die 120 through the die attach film AF. The interconnect circuit structure 126 at the front side 120F of the second semiconductor die 120 is electrically and physically connected to the interconnect circuit structure 118 of the first semiconductor die 110 through a hybrid-bonding process and thus the hybrid-bonding structure is formed between the first semiconductor die 110 and the second semiconductor die 120. For example, the outermost dielectric layer in the interconnect circuit structure 126 is in direct contact with the outermost dielectric layer in the interconnect circuit structure 118 and the outermost conductive layer in the interconnect circuit structure 126 is in direct contact with the outermost conductive layer in the interconnect circuit structure 118. There is no gap between the interconnect circuit structure 118 and the interconnect circuit structure 126.

The insulating encapsulation 180 is disposed between the redistribution circuit structure 160 and the redistribution circuit structure 190 in a one-piece form. The insulating encapsulation 180 includes polymer material and optionally fillers dispersed therein. The polymer material of the insulating encapsulation 180 may continuously extend between the first semiconductor die 110 and the through insulation via 170 as well as between the second semiconductor die 120 and the through insulation via 170 without a physically boundary therebetween.

The first semiconductor die 110 is greater than the second semiconductor die 120 in the lateral dimension and the sidewall of the first semiconductor die 110 and the sidewall of the second semiconductor die 120 are not aligned in the thickness direction to construct the stair structure ST1. The insulating encapsulation 180 formed in a one-piece form encapsulates the stair structure ST1 and has an outline conform to the stair structure ST1. For example, the insulating encapsulation 180 has a first sidewall 180SA and a second sidewall 180SB respectively adjacent to the first semiconductor die 110 and the second semiconductor die 120. The semiconductor substrate 112, the interconnect circuit structure 118 and the interconnect circuit structure 150 of the first semiconductor die 110 are in direct contact with the insulating encapsulation 180 at the first sidewall 180SA, and the semiconductor substrate 122 and the interconnect circuit structure 126 of the second semiconductor die 120 are in contact with the insulating encapsulation 180 at the secibd sidewall 180SB. In addition, the first sidewall 180SA keeps the lateral distance D2 from the second sidewall 180SB.

A portion 182 of the insulating encapsulation 180 extending between the first sidewall 180SA and the second sidewall 180SB overlaps the first semiconductor die 110 and another portion 184 of the insulating encapsulation 180 extends between the first sidewall 180SA and an adjacent through insulation via 170. The portion 182 is arranged next to the second portion 184 and overlaps the first semiconductor die 110 in the thickness direction. The first portion 182 and the second portion 184 are formed in a one-piece form without a physical boundary therebetween and may be divided by a virtual line VL aligning the first sidewall 180SA.

The insulating encapsulation 180 has multiple thicknesses. The portion 182 of the insulating encapsulation 180 extending between the first sidewall 180SA and the second sidewall 180SB has a thinner thickness than the portion 184 of the insulating encapsulation 180. In other words, the portion 182 of the insulating encapsulation 180 extending between the first sidewall 180SA and the second sidewall 180SB has a thickness T1 and the portion 184 of the insulating encapsulation 180 extending from the first sidewall 180SA to an adjacent through insulation via 170 has a thickness T2 that is greater than the thickness T1. The other portion of the insulating encapsulation 180 extending between the through insulation vias 170 may also have the same thickness as the portion 184. The insulating encapsulation 180 has a first bottom surface 180BA extending between the first sidewall 180SA and the second sidewall 180SB and a second bottom surface 180BB connected to the first sidewall 180SA and extending away from the second sidewall 180SB. The first bottom surface 180BA keeps a vertical distance VD1 from the second bottom surface 180BB. In some embodiments, the vertical distance VD1 is identical to a thickness of the first semiconductor die 110.

Figure 2A:
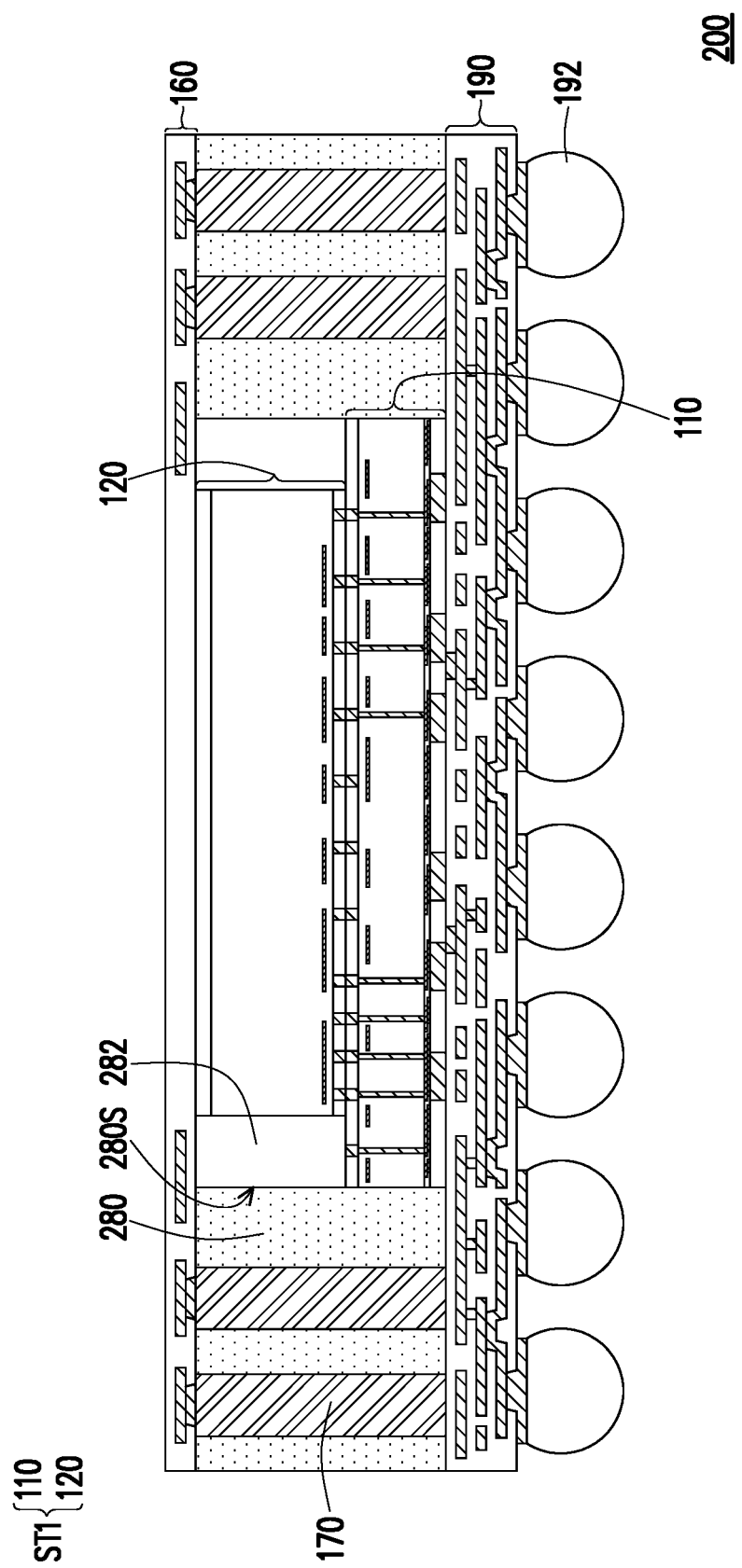
FIG. 2A schematically illustrates a semiconductor package in accordance with some embodiments of the disclosure.

FIG. 2A schematically illustrates a semiconductor package in accordance with some embodiments of the disclosure. A semiconductor package 200 includes a first semiconductor die 110, a second semiconductor die 120, an insulating encapsulation 280, a redistribution circuit structure 160, a redistribution circuit structure 190 with the conductive terminal 192, through insulation vias 170 and a lateral fill 282. The second semiconductor die 120 stacks with the first semiconductor die 110 in a top and bottom manner. The insulating encapsulation 280 surrounds the first semiconductor die 110 and the second semiconductor die 120 and is disposed between the redistribution circuit structure 160 and the redistribution circuit structure 190. The through insulation vias 170 are embedded in the insulating encapsulation 280 and pass through the insulating encapsulation 280 to physically and electrically connect to the redistribution circuit structure 160 and the redistribution circuit structure 190. The lateral fill 282 is disposed between the insulating encapsulation 280 and the second semiconductor die 120 and overlaps the first semiconductor die 110.

The first semiconductor die 110, the second semiconductor die 120, the redistribution circuit structure 160, the redistribution circuit structure 190, the conductive terminal 192, and the through insulation vias 170 are substantially similar to the corresponding components described in the previous figures and the details for these components may refer to the previous descriptions without reiterating here. Specifically, the semiconductor package 200 is fabricated by performing the steps described in FIG. 1A to FIG. 1J and FIG. 1L to FIG. 1M, without performing the step of FIG. 1K. Therefore, the lateral fill 282 remains in the semiconductor package 200 and is disposed between the insulating encapsulation 280 and the second semiconductor die 120 that is smaller than the firs semiconductor die 110 in lateral dimension. In addition, the material of the lateral fill 282 may be the temporary glue material that is described above. Therefore, the material of the lateral fill 282 is different from the insulating encapsulation 280. In some embodiments, the material of the insulating encapsulation 280 includes polymer materials dispersed therein with fillers such as silica, glass fibers or the like.

The first semiconductor die 110 is greater than the second semiconductor die 120 in lateral dimension and the first semiconductor die 110 and the second semiconductor die 120 to construct a stair structure ST1. The lateral fill 282 fills the stair structure ST1 to compensate a difference of lateral dimension between the first semiconductor die 110 and the second conductor die 120. The sidewall of the lateral fill 282 is aligned to the sidewall of the first semiconductor die 110 in a smooth or straight linear path, but the disclosure is not limited thereto. The sidewall 280S of the insulating encapsulation 280 is in direct contact with the sidewall of the lateral fill 282 and the sidewall of the first semiconductor die 110 and is a smooth or straight linear sidewall. The insulating encapsulation 280 may have an identical thickness that is substantially equal to the distance between the redistribution circuit structure 160 and the redistribution circuit structure 190.

Figure 2B:
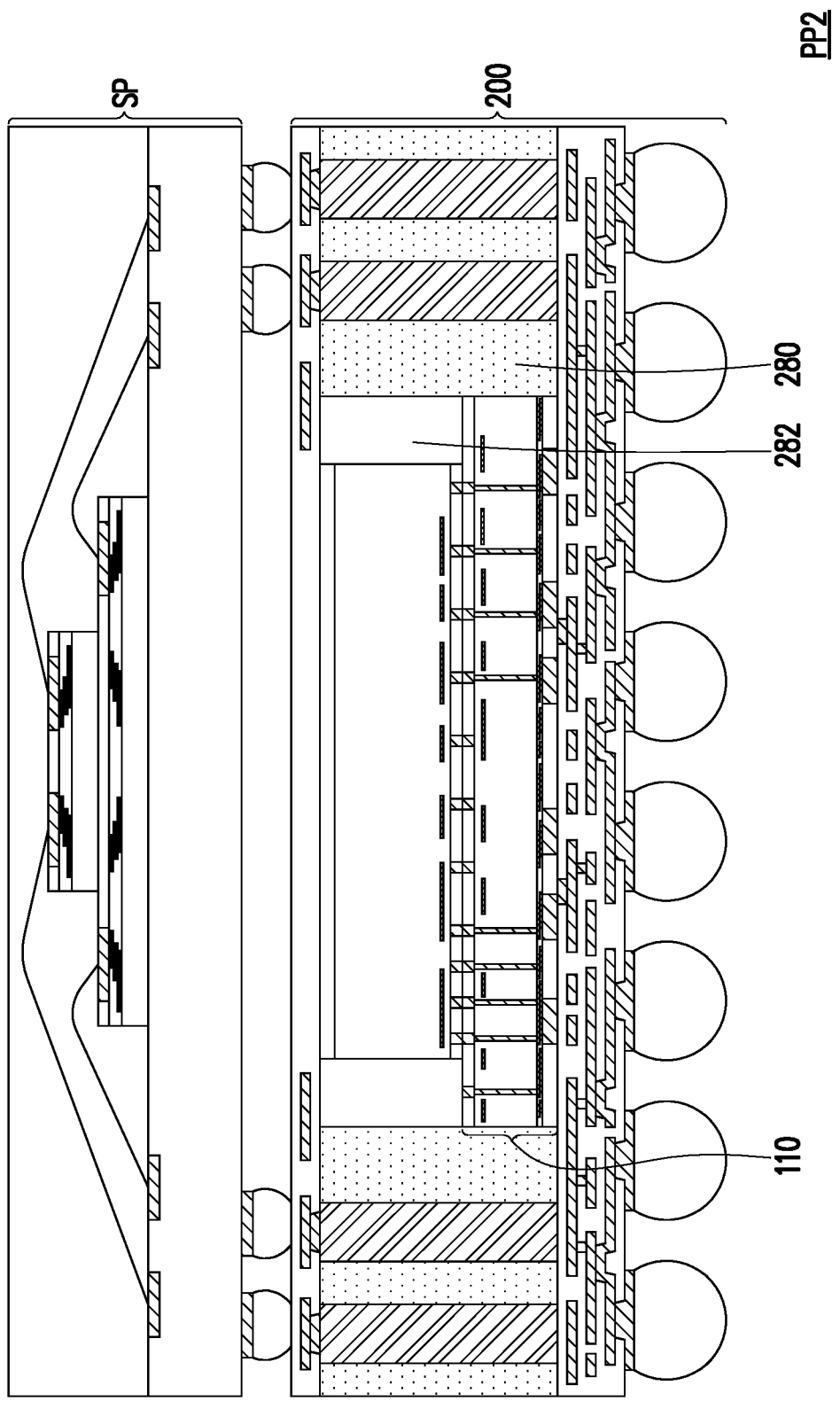
FIG. 2B schematically illustrates a package structure in accordance with some embodiments of the disclosure.

In some embodiments, as shown in FIG. 2B, the semiconductor package 200 is connected to another semiconductor package such as the semiconductor package SP that is similar to the semiconductor package SP shown in FIG. 1N to form a package structure PP2 that is a package on package (PoP) structure. The package structure PP2 is different from the package structure PP1 of FIG. 1N in that the semiconductor package 200 has a lateral fill 282 and the insulating encapsulation 280 in the semiconductor package 200 has smooth or straight linear sidewall in contact with the lateral fill 282 and the first semiconductor die 110. Other details of the package structure PP2 may refer to the package structure PP1.

FIG. 3A to FIG. 3J schematically illustrates a method of fabricating a semiconductor package in accordance with some embodiments of the disclosure. A semiconductor grain 310' that is cut from a first semiconductor wafer (not shown) is placed on and carried by a carrier frame CF4. The semiconductor grain 310' includes a semiconductor substrate 312', through silicon via structures 314', circuit components 316 and an interconnect circuit structure 318. The semiconductor substrate 312' may be semiconductor substrate such as silicon substrate. The circuit components 316 include active components (e.g., transistors or the like) and passive components (e.g., resistors, capacitors, inductors, or the like) formed in the semiconductor substrate 312', for example adjacent to a front side 310F of the semiconductor grain 310'. The active components and passive components are formed through front end of line (FEOL) fabrication processes of a semiconductor wafer. The through silicon via structures 314' are formed in the semiconductor substrate 312' and each extends from the surface adjacent to the front side 310F into a certain depth of the semiconductor substrate 312' without passing through the semiconductor substrate 312' in the thickness direction. The interconnect circuit structure 318 may include interconnect wiring layers (e.g., copper interconnect wirings) and dielectric layer stacked alternately, wherein the interconnect wiring layers of the interconnect circuit structure 318 are electrically connected to the active components and/or the passive components in the semiconductor substrate 312'. The interconnect circuit structure 318 and the through silicon via structures 314' are formed through back end of line (BEOL) fabrication processes of the semiconductor wafer. In the following steps, the semiconductor grain 310' would be processed to form at least one first semiconductor die for a semiconductor package.

Figure 3A:
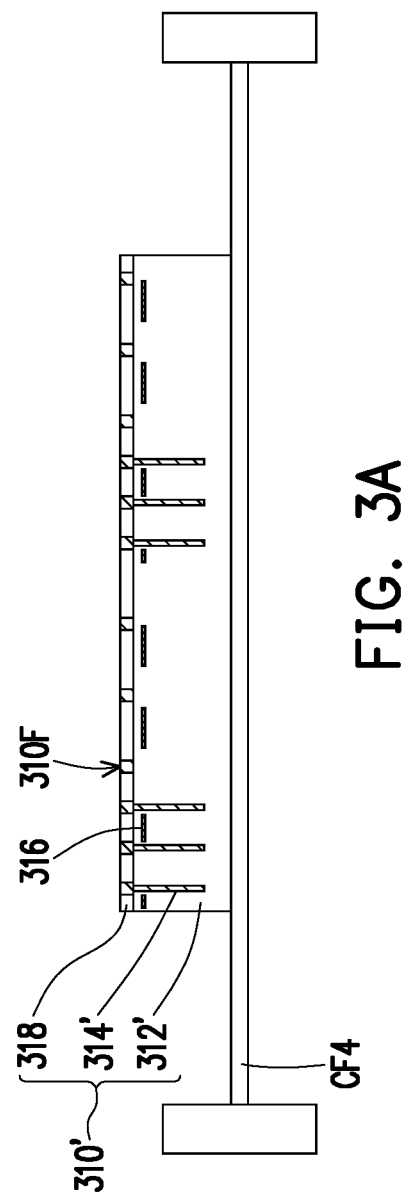
Figure 3B:
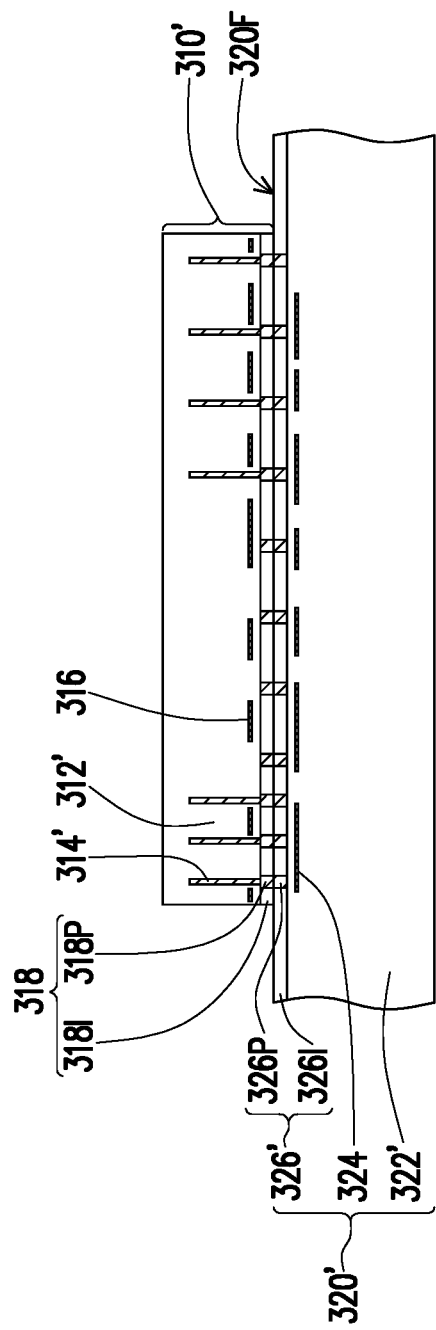

In FIG. 3B, the semiconductor grain 310' is bonded to another semiconductor wafer 320' through a chip-on-wafer bonding process. The semiconductor wafer 320' includes a wafer substrate 322', circuit components 324 and an interconnect circuit structure 326'. The circuit components 324 are formed on/in the wafer substrate 322' adjacent to a front side 320F of the semiconductor wafer 320' and include active components (e.g., transistors or the like) and passive components (e.g., resistors, capacitors, inductors, or the like) that are formed in the second semiconductor wafer (not shown) through front end of line (FEOL) fabrication processes of the semiconductor wafer and may construct logic circuits, memory or a combination thereof. The interconnect circuit structure 326' is disposed at the front side 320F and includes interconnect wiring layers (e.g., copper interconnect wirings) and dielectric layer stacked alternately, wherein the interconnect wiring layers of the interconnect circuit structure 326' are electrically connected to the circuit components 324.

In the embodiment, the semiconductor grain 310' is bonded to the semiconductor wafer 320' by the interconnect circuit structure 318 of the semiconductor grain 310' in direct contact with the interconnect circuit structure 326' of the semiconductor wafer 320'. Specifically, the semiconductor grain 310' is bonded to the semiconductor wafer 320' through a hybrid boding process. For example, the conductive features 318P formed in the interconnect circuit structure 318 are in contact with the conductive features 326P formed in the interconnect circuit structure 326', and the insulation layer 318I formed in the interconnect circuit structure 318 is in contact with the insulation layer 326I formed in the interconnect circuit structure 326'. There is no gap between the interconnect circuit structure 318 and the interconnect circuit structure 326'.

Figure 3C:
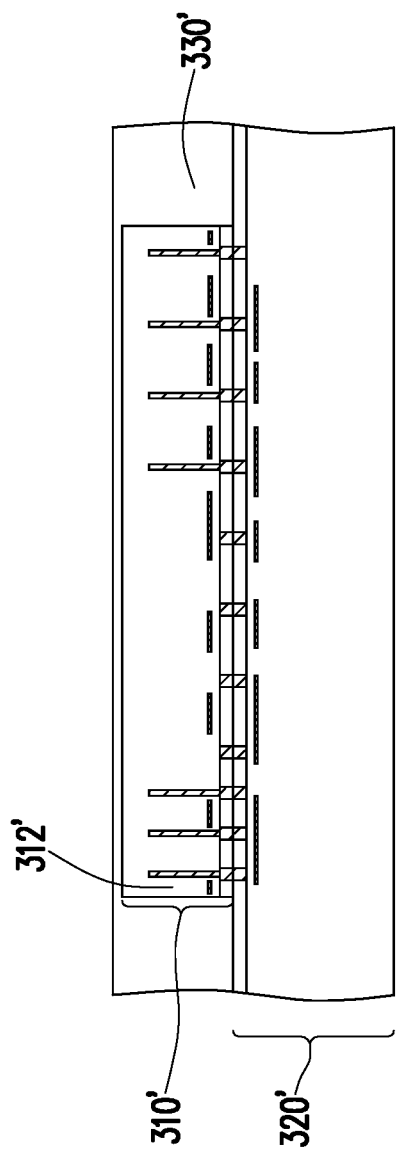

In FIG. 3C, a lateral fill material 330' is formed over the semiconductor wafer 320' to surround the semiconductor grain 310'. The lateral fill material 330' may be thicker than the semiconductor grain 310' and cover over the semiconductor grain 310'. A material of the lateral fill material 330' includes a dielectric material such as low temperature polyimide without heterogeneous particles therein. The material of the lateral fill material 330' would not cause contamination in the following process.

The thickness of the lateral fill material 330' is reduced until the semiconductor substrate 312' and a reveal process of through silicon via is performed on the semiconductor substrate 312' and the through silicon via structures 314' to form the through silicon vias 314 in the semiconductor substrate 312 shown in FIG. 3D. An isolation layer 314I is also formed on the semiconductor substrate 312 at a back side 310B in the reveal process. In some embodiments, the isolation layer 140 may have a thickness, for example around 2 µm or more, sufficient to isolate the semiconductor substrate 312 from the material that may be diffused from the overlying layers.

Figure 3E:
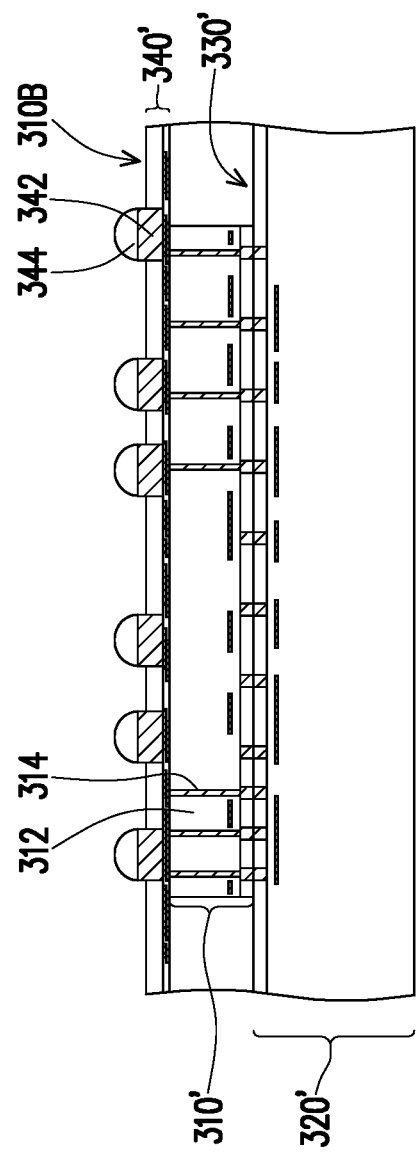

In FIG. 3E, an interconnect circuit structure 340' is formed on the lateral fill material 330' and the semiconductor grain 310' at the back side 310B of the semiconductor grain 310'. The interconnect circuit structure 340' may include interconnect wiring layers (e.g., copper interconnect wirings) and dielectric layer stacked alternately. The interconnect wiring layers of the interconnect circuit structure 340' are electrically connected to the through silicon vias 314 formed in the semiconductor substrate 312. In addition, a conductive feature 342 is formed on the outermost of the interconnect circuit structure 340' and a cap material 344 is formed on top of the conductive feature 342. The conductive feature 342 may be a cupper via, a liner cupper via, or the like. In some embodiments, the conductive feature 342 is formed of a metal material such as cupper and electrically connect to the conductive wirings in the interconnect circuit structure 340'. The cap material 344 is optionally formed by using solder material. The conductive feature 342 with the cap material 344 on top serves as a testing pad for an electric test. For example, a wafer-level chip probing process may be performed on the semiconductor grain 310' using the conductive feature 342 with the cap material 344, such that tested and reliable known good dies (KGDs) may be recognized. In some embodiments, the cap material 344 may be omitted and the conductive feature 342 may not be covered by the cap material 344 in the wafer-level chip probing process.

Figure 3F:
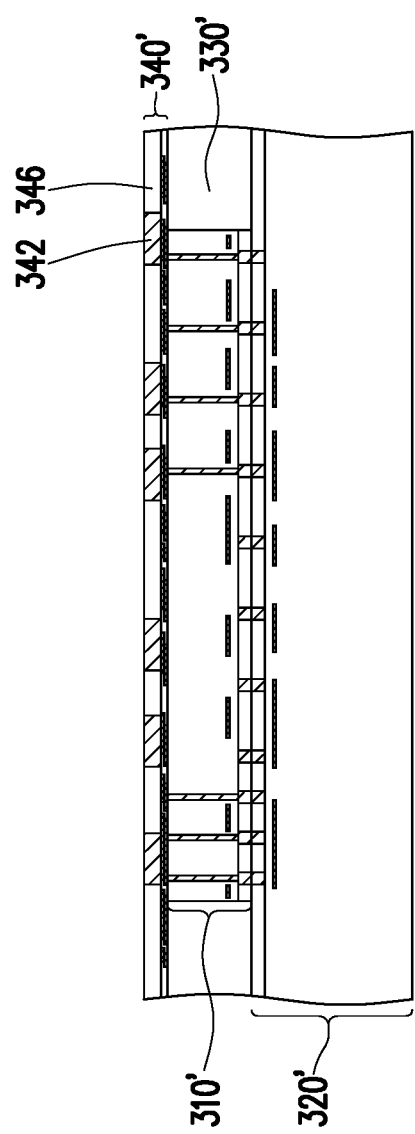

After performing the wafer-level chip probing process, the cap material 344 is removed. In some embodiments, the cap material 344 is removed from the top surfaces of the conductive features 342 through an etching process. A dielectric layer 346 is formed to laterally surround the conductive features 342 as shown in FIG. 3F. A material of the dielectric layer 346 may include polyimide, for example, low temperature polyimide, high temperature polyimide or the like. The dielectric layer 346 is formed with a sufficient thickness to compensate the staggered surface caused by the protruding conductive features 342 and serves as a planarization layer. In some embodiments, the dielectric layer 346 and the lateral fill material 330' include the same material.

Figure 3G:
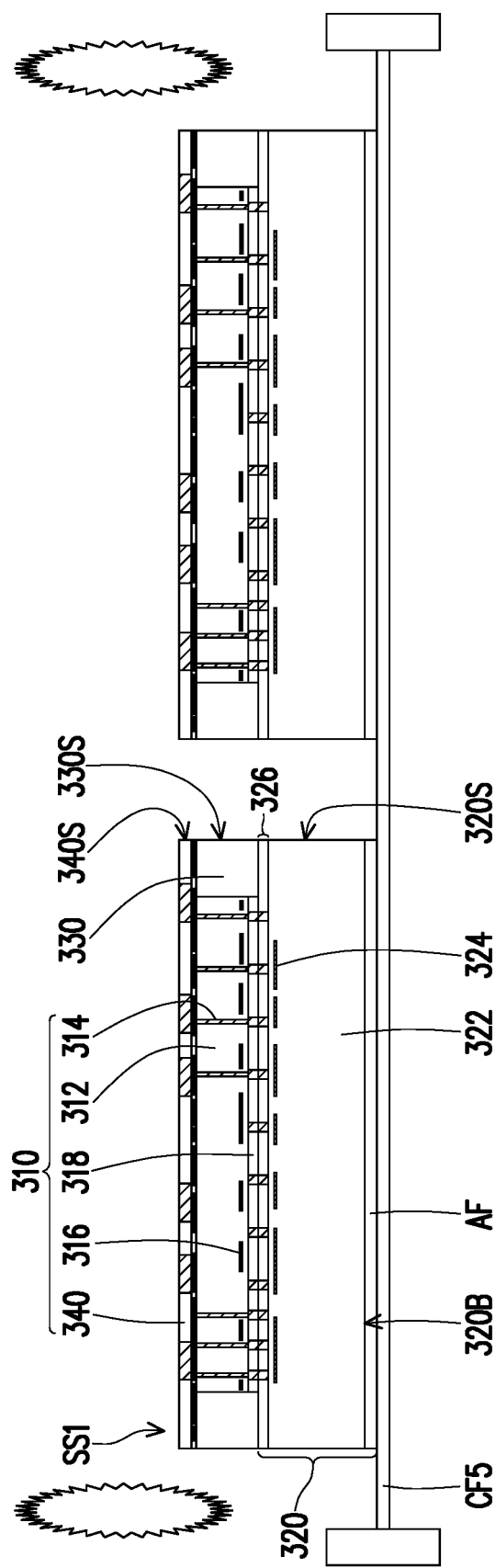

A singulation process is performed to form a singulated structure SS1 as shown in FIG. 3G. Specifically, a die saw process is performed so that the singulated structure SS1 having a first semiconductor die 310 staking with a second semiconductor die 320 in FIG. 3G. As shown in FIG. 3F and FIG. 3G, the semiconductor wafer 320' is cut to form the second semiconductor die 320, and the lateral fill material 330' and the interconnect circuit structure 340' are cut to form the first semiconductor die 310 integrated with the lateral fill 330. Prior to the singulation process, the semiconductor wafer 320' may be thinned to a specific thickness from the backside 320B of the semiconductor wafer 320' without damaging the circuit components 324 formed adjacent to the front side 320F.

In FIG. 3G, the first semiconductor die 310 includes the semiconductor substrate 312, the through silicon vias 314, the circuit components 316, the interconnect circuit structure 318 and the interconnect circuit structure 340. The second semiconductor die 320 includes the semiconductor substrate 322, the circuit components 324 and the interconnect circuit structure 326. The semiconductor substrate 322 is cut from the wafer substrate 322' and the interconnect circuit structure 326 is cut from the interconnect circuit structure 326'. The first semiconductor die 310 and the second semiconductor die 320 are stacked with each other through a hybrid-bonding process so that the interconnect circuit structure 318 is in direct contact with the interconnect circuit structure 326.

In the embodiment, the semiconductor substrate 312 of the first semiconductor die 310 is smaller than the second semiconductor die 320 in the lateral dimension and the lateral fill 330 is positioned on a portion of the second semiconductor die 320 that exceeds the semiconductor substrate 312 in the lateral direction. The interconnect circuit structure 340 exceeds the semiconductor substrate 312 in the lateral direction and the lateral fill 330 is disposed between the exceeding portion of the second semiconductor die 320 and the exceeding portion of the interconnect circuit structure 340. Due to the die saw process, the sidewall 340S of the interconnect circuit structure 340, the sidewall 330S of the lateral fill 330 and the sidewall 320S of the second semiconductor die 320 are aligned in a smooth or straight linear path. Accordingly, the singulated structure SS1 may have a smooth or straight linear sidewall.

Figure 3H:
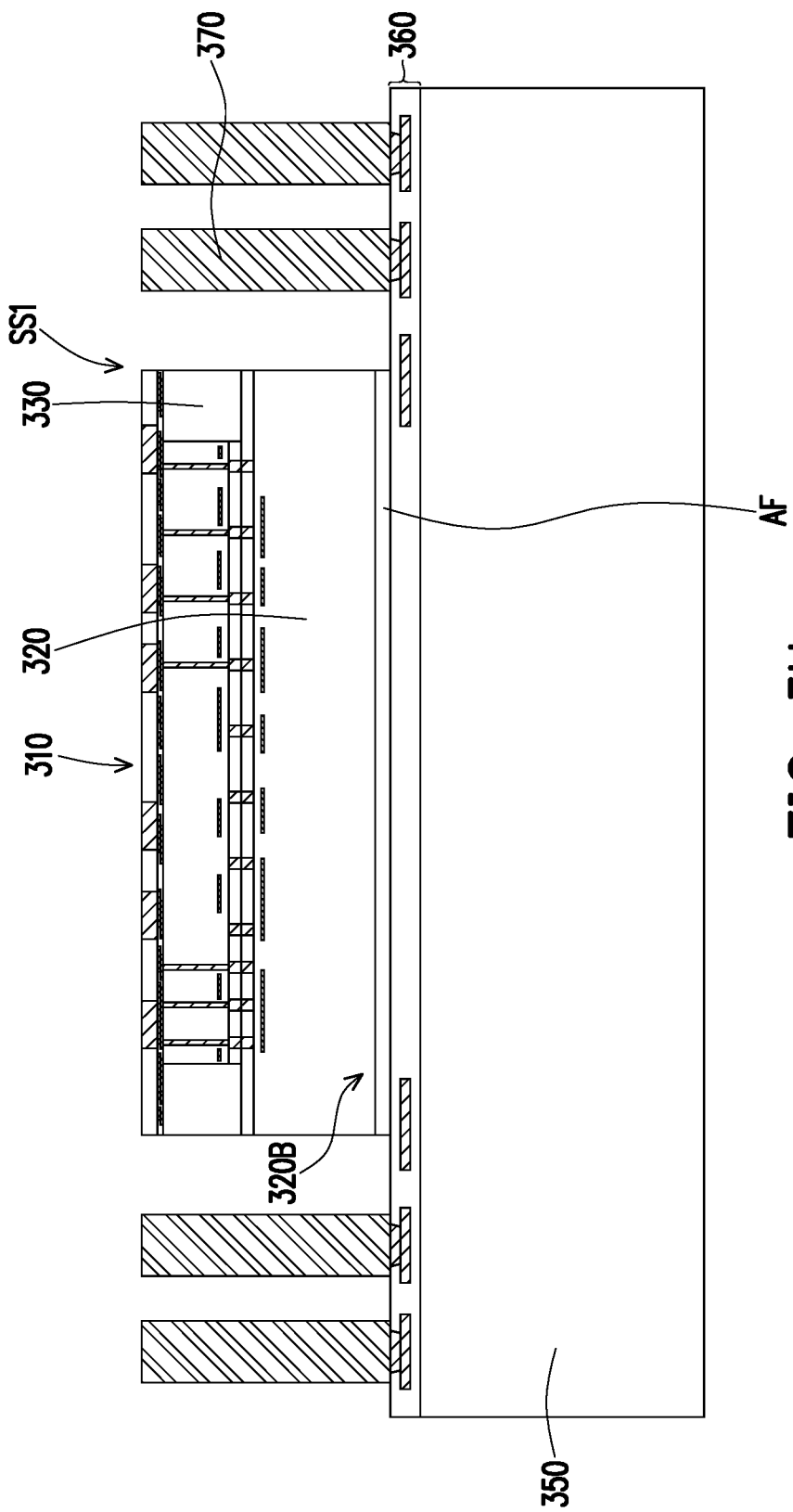

The singulated structure SS1 formed in the step of FIG. 3G is picked and placed on a carrier substrate 350 as shown in FIG. 3H. The singulated structure SS1 is placed on the carrier substrate 350. The second semiconductor die 320 is positioned between the first semiconductor die 310 and the carrier substrate 350. Specifically, a redistribution circuit structure 360 and through insulation vias 370 are formed on the carrier substrate 350 in advance and the singulated structure SS1 is attached on the carrier substrate 350 through a die attach film AF. In some embodiments, the carrier substrate 142 is a glass substrate, the redistribution circuit structure 360 may include at least one conductive wiring layer and at least one dielectric layer stacked alternately, and each through insulation via 370 is a conductive pillar structure and electrically connected to the conductive wiring in the redistribution circuit structure 360. The second semiconductor die 320 is attached onto the redistribution circuit structure 3160 without an electric transmission path formed passing through the back side 320B of the second semiconductor die 320, but the disclosure is not limited thereto.

Figure 3I:
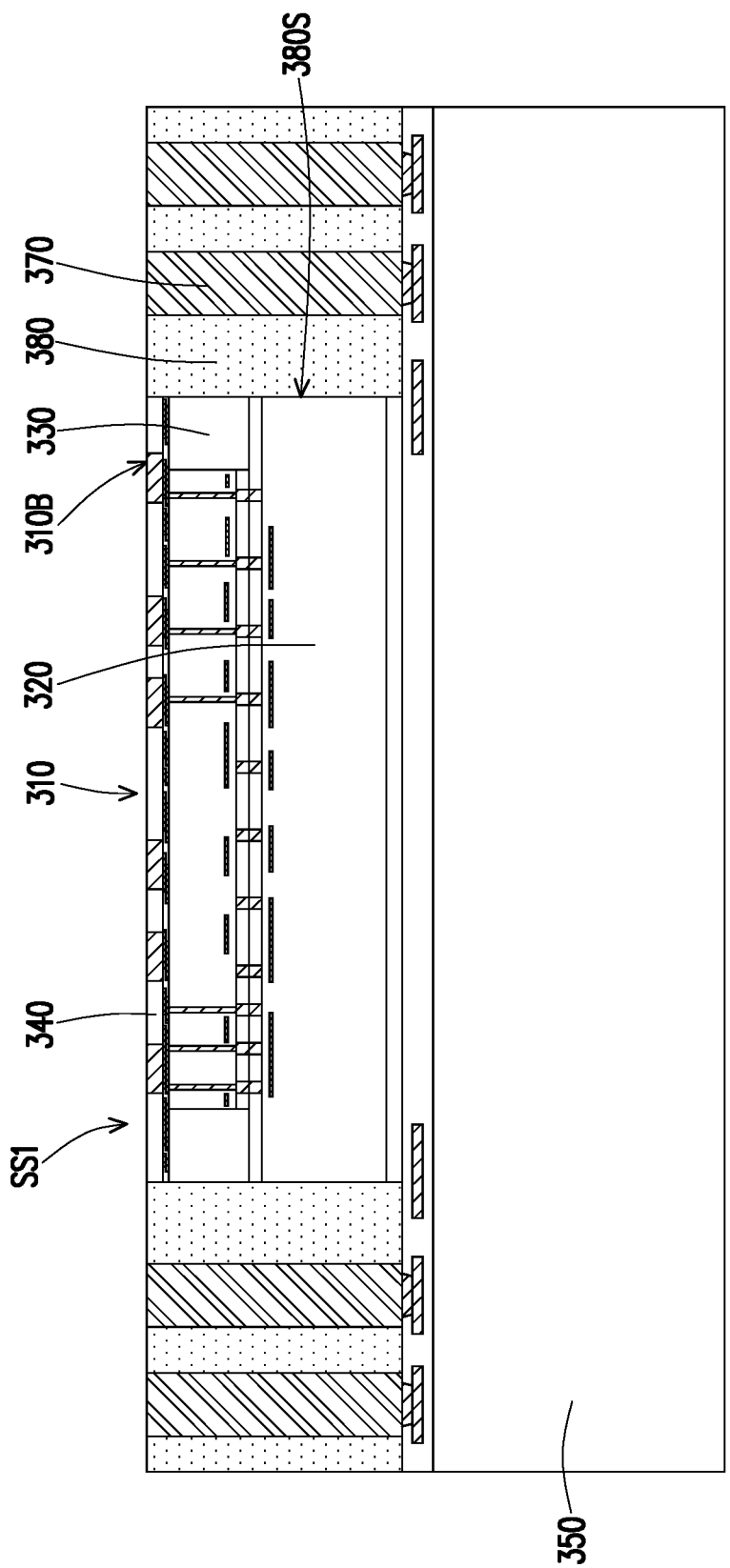

In FIG. 3I, an insulating encapsulation 380 is formed on the carrier substrate 350. The insulating encapsulation 380 includes a polymer material with filler therein, in accordance with some embodiments. The insulating encapsulation 380 is formed using a molding process, in accordance with some embodiments. In some embodiments, a grinding process or a chemical mechanical polishing process is performed on the insulating encapsulation 380 to expose the through insulation vias 370 and the interconnect circuit structure 340 at the back side 310B of the first semiconductor die 310. Accordingly, the insulating encapsulation 380 laterally encapsulates the singulated structure SS1. The through insulation via 370 extends through the insulating encapsulation 380 in the thickness direction. The interconnect circuit structure 340 of the first semiconductor die 310, the insulating encapsulation 380 and the through insulation vias 370 are coplanar at the back side 310B of the first semiconductor die 310.

The sidewall 380S of the insulating encapsulation 380 is in direct contact with the interconnect circuit structure 340 of the first semiconductor die 310, the lateral fill 330, and the second semiconductor die 320 and extends along a substantially smooth or straight linear path. The material of the lateral fill 330 is different from the material of the encapsulation 380. In some embodiments, the material of the lateral fill 340 may be the same as the dielectric layer formed in the interconnect circuit structure 340 and thus the interface between the lateral fill 340 and the insulating encapsulation 380 and the interface between the interconnect circuit structure 340 and the insulating encapsulation 380 may present similar property such as thermal conduction.

Figure 3J:
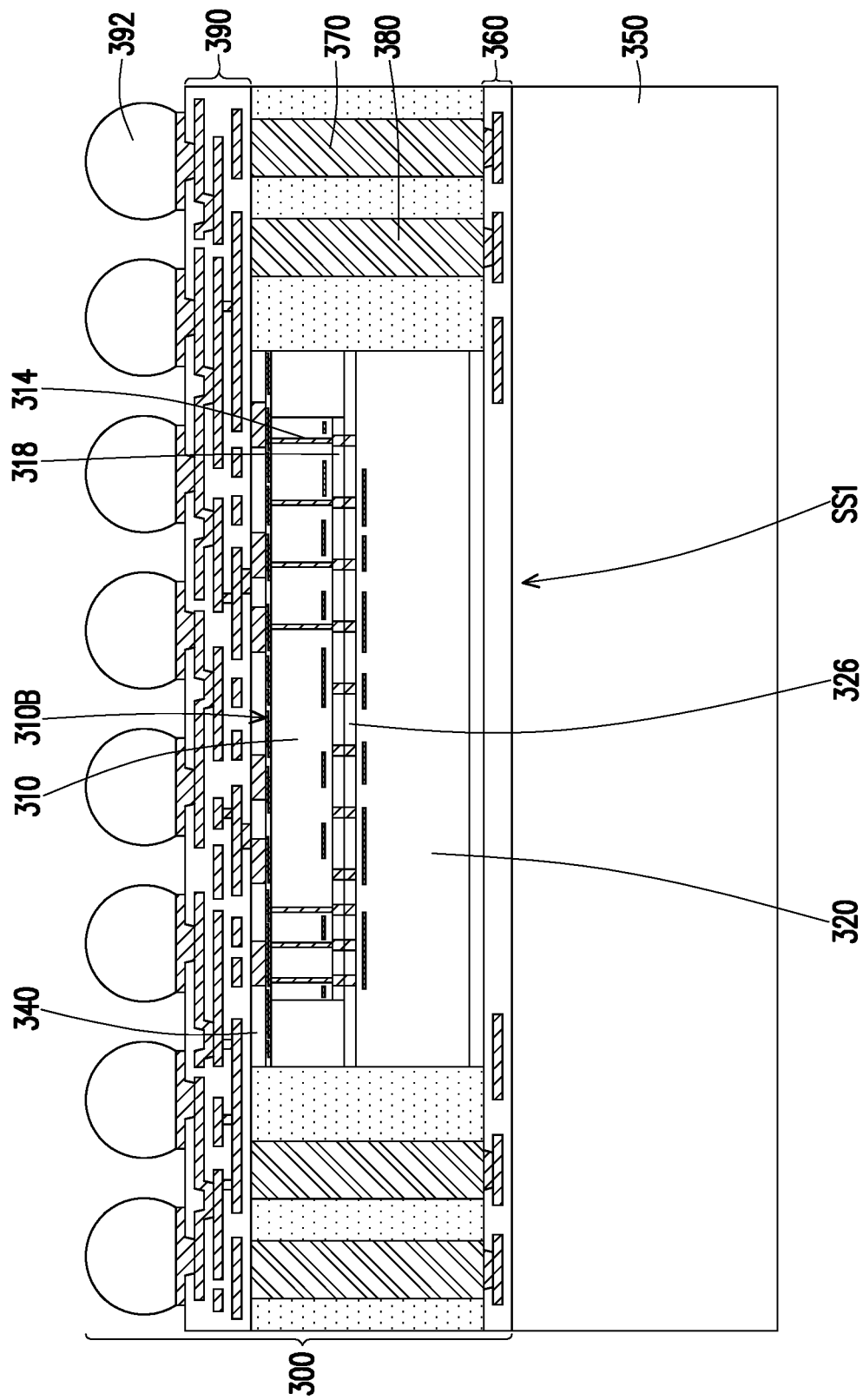

In FIG. 3J, another redistribution circuit structure 390 is formed on the first semiconductor die 310 of the singulated structure SS1, the through insulation via 370 and the insulating encapsulation 380. The redistribution circuit structure 390 may include at least one conductive wiring layer and at least one dielectric layer stacked alternately. The redistribution circuit structure 390 is electrically connected to the through insulation via 370 and the first semiconductor die 310. In addition, the first semiconductor die 310 is electrically connected to the second semiconductor die 320 though the hybrid-bonding between the interconnect circuit structure 318 formed in the first semiconductor die 310 and the interconnect circuit structure 326 formed in the second semiconductor die 320, and the interconnect circuit structure 318 is electrically connected to the interconnect circuit structure 340 through the through silicon vias 314 formed in the first semiconductor die 310. Accordingly, the redistribution circuit structure 390 is electrically connected to the second semiconductor die 320 through the first semiconductor die 310.

In FIG. 3J, a conductive terminal 392 is further formed on the redistribution circuit structure 390 to form a semiconductor package 300 on the carrier substrate 350. The conductive terminal 392 may be a solder ball formed on a side of the redistribution circuit structure 390 away from the insulating encapsulation 380. The conductive terminal 392 is electrically to a conductive pad/layer formed in the redistribution circuit structure 390 and used for electrically connecting to an external device. In some embodiments, the carrier substrate 350 may be removed from the semiconductor package 300.

Figure 3K:
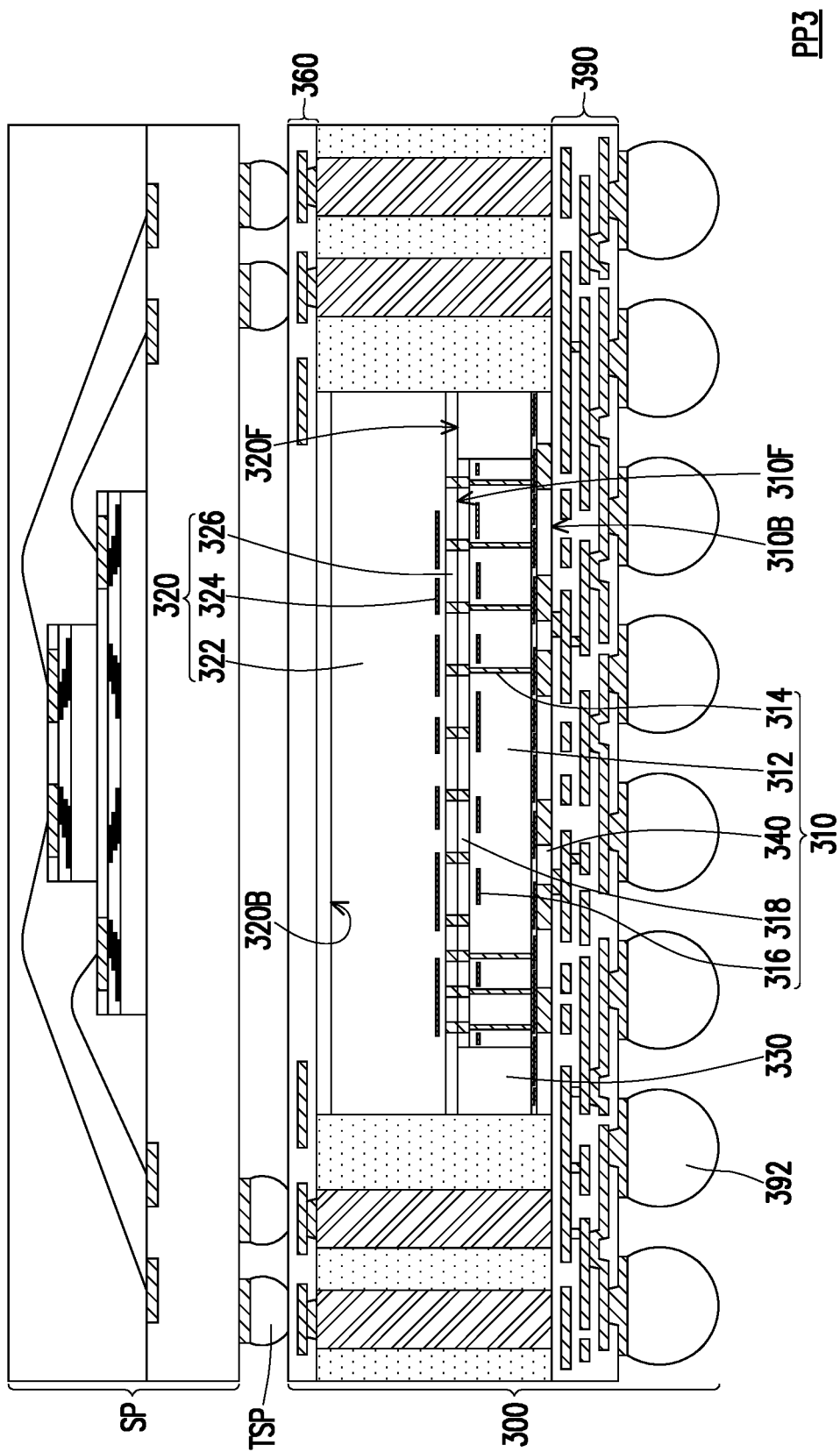
FIG. 3K schematically illustrates a package structure in accordance with some embodiments of the disclosure.

FIG. 3K schematically illustrates a package structure in accordance with some embodiments of the disclosure. The semiconductor package 300 is separated from the carrier substrate 350 (shown in FIG. 3J) and connected to another semiconductor package SP to construct a package structure PP3. The package structure PP3 is a package-on-package (PoP) structure which includes two or more semiconductor packages stacking with one another. A conductive terminal TSP is provided at a side of the semiconductor package SP and mounted onto the semiconductor package 300. In some embodiments, the semiconductor package 300 is a logic package, the semiconductor package SP is a DRAM package, and the conductive terminal TSP includes solder balls. The conductive terminal TSP may be bonded on the redistribution circuit structure 360. The semiconductor package SP and the conductive terminal 392 are located at opposite sides of the semiconductor package 300.

In the semiconductor package 300, the first semiconductor die 310 includes the semiconductor substrate 312, the through silicon vias 314, the circuit components 316, the interconnect circuit structure 318 and the interconnect circuit structure 340. The through silicon vias 314 are formed embedded in the semiconductor substrate 312 and pass through the semiconductor substrate 312 in the thickness direction. The circuit components 316 are disposed on/in the semiconductor substrate 312 at the front side 310F of the first semiconductor die 310. The interconnect circuit structure 318 is disposed on the semiconductor substrate 312 at the front side 310F of the first semiconductor die 310. The interconnect circuit structure 340 is disposed on the semiconductor substrate 312 at the back side 310B of the first semiconductor die 310 and exceeds the semiconductor substrate 312 in the lateral direction. An exceeding portion of the interconnect circuit structure 340 is disposed overlapping the lateral fill 330. In addition, the interconnect circuit structure 340 is connected to the redistribution circuit structure 390 physically and electrically.

The second semiconductor die 320 includes the semiconductor substrate 322, the circuit components 324 and the interconnect circuit structure 326. The circuit components 324 are disposed in the semiconductor substrate 322 adjacent to the front side 320F of the second semiconductor die 320. The interconnect circuit structure 326 is disposed on the semiconductor substrate 322 at the front side 320F of the second semiconductor die 320. The interconnect circuit structure 326 is in contact with the interconnect circuit structure 318 of the first semiconductor die 310. The front side 320F of the second semiconductor die 320 faces the first semiconductor die 310 and the back side 320B of the second semiconductor die 320 attaches to the redistribution circuit structure 360. The first semiconductor die 310 and the second semiconductor die 320 are stacked with each other in a front side to front side manner.

Figure 4B:
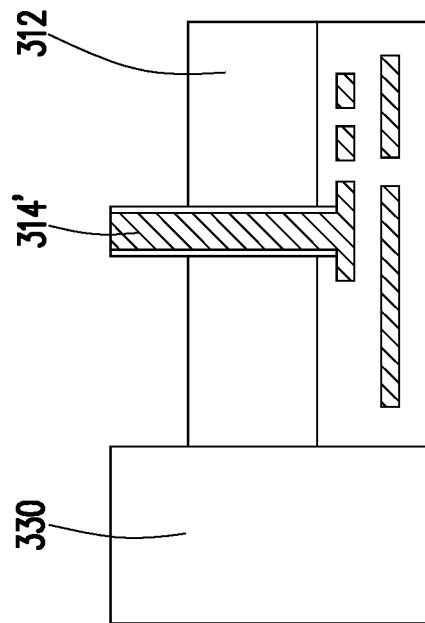
FIG. 4A to FIG. 4D are cross-sectional views schematically illustrating a reveal process for through silicon vias in accordance with some embodiments.
Figure 4A:
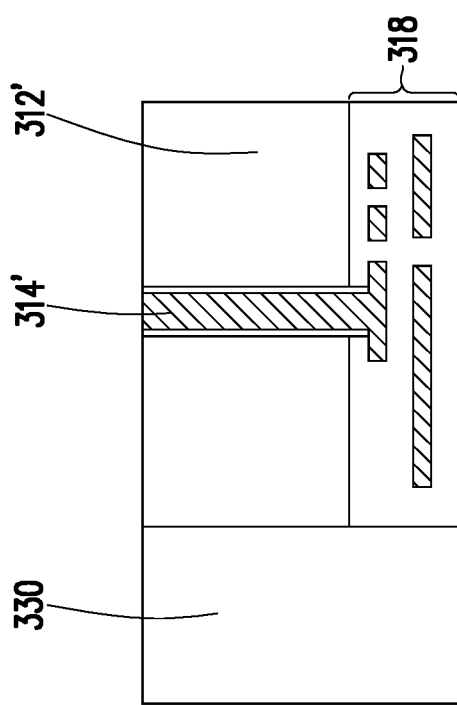

FIG. 4A to FIG. 4D schematically illustrates a reveal process for through silicon vias in accordance with some embodiments. The reveal process may be applicable to the step of FIG. 3D. As shown in FIG. 4A, an enlarged view shows the wafer substrate 312', the through silicon via structure 314', the interconnect circuit structure 318 and the lateral fill 330'. A grinding process may be performed on the wafer substrate 312' and the lateral fill 330' until the through silicon via structure 314' is exposed as shown in FIG. 4A. The exposed top of the through silicon via structure 314' may be leveled with the semiconductor substrate 312' and the lateral fill 330'. The grinding process includes a mechanical grinding process, a CMP process, or combinations thereof.

In FIG. 4B, a portion of the semiconductor substrate 312' is removed to form the semiconductor substrate 312 using an etching technique, such as wet etching, dry etching or the like, until a portion of each through silicon via structure 314' is exposed and protruded away from the etched surface of the semiconductor substrate 312. During the etching process of reducing the thickness of the semiconductor substrate 312', the lateral fill 330' is not covered by any protection layer such as hard mask, photoresist material or the like. During the etching process, the lateral fill 330 is also exposed to the etching apparatus without causing a contamination in the etching apparatus. In some embodiments, the material of the lateral fill 330' includes low temperature polyimide that may be curable at a temperature lower than 250° C., but the disclosure is not limited thereto.

Figure 4D:
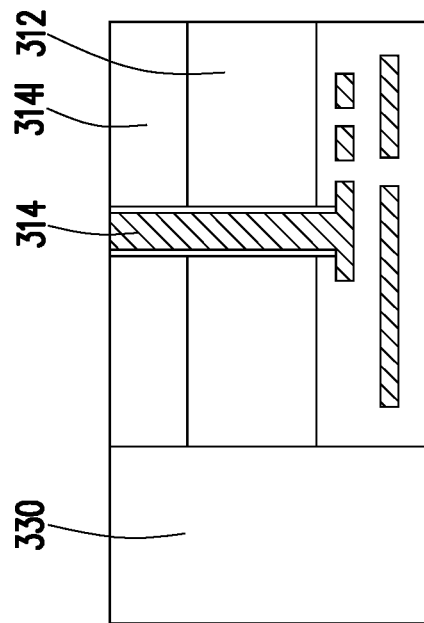
Figure 4C:
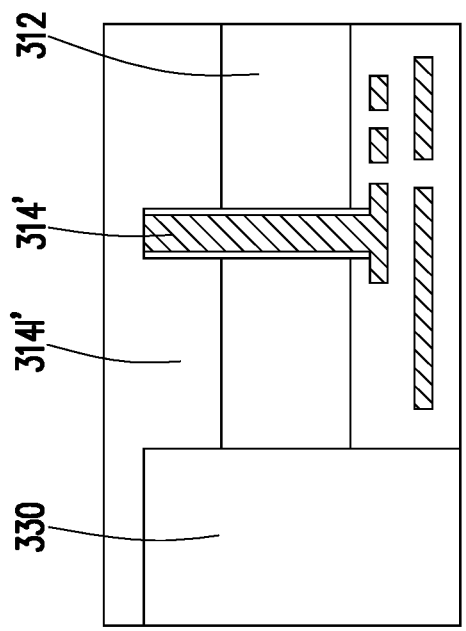

A level difference is formed between the lateral fill 330' and the semiconductor substrate 312, and in FIG. 4C, an isolation material 314I' is formed on the semiconductor substrate 312 to compensate the level difference between the lateral fill 330' and the semiconductor substrate 312. In some embodiments, the isolation material 314I' is made of low temperature polyimide that may be curable at a temperature lower than 250° C., but is not limited thereto. The material of the lateral fill 330' may be the same as the material of the isolation material 314I', but is not limited thereto. In FIG. 4D, a grinding process may be performed to obtain the isolation layer 314I, the through silicon via 314 and the lateral fill 330'. The isolation layer 314I is leveled with the lateral fill 330' and the through silicon via 314. The through silicon via 314 passes through the semiconductor substrate 312 and the isolation layer 314I in the thickness direction.

Figure 5:
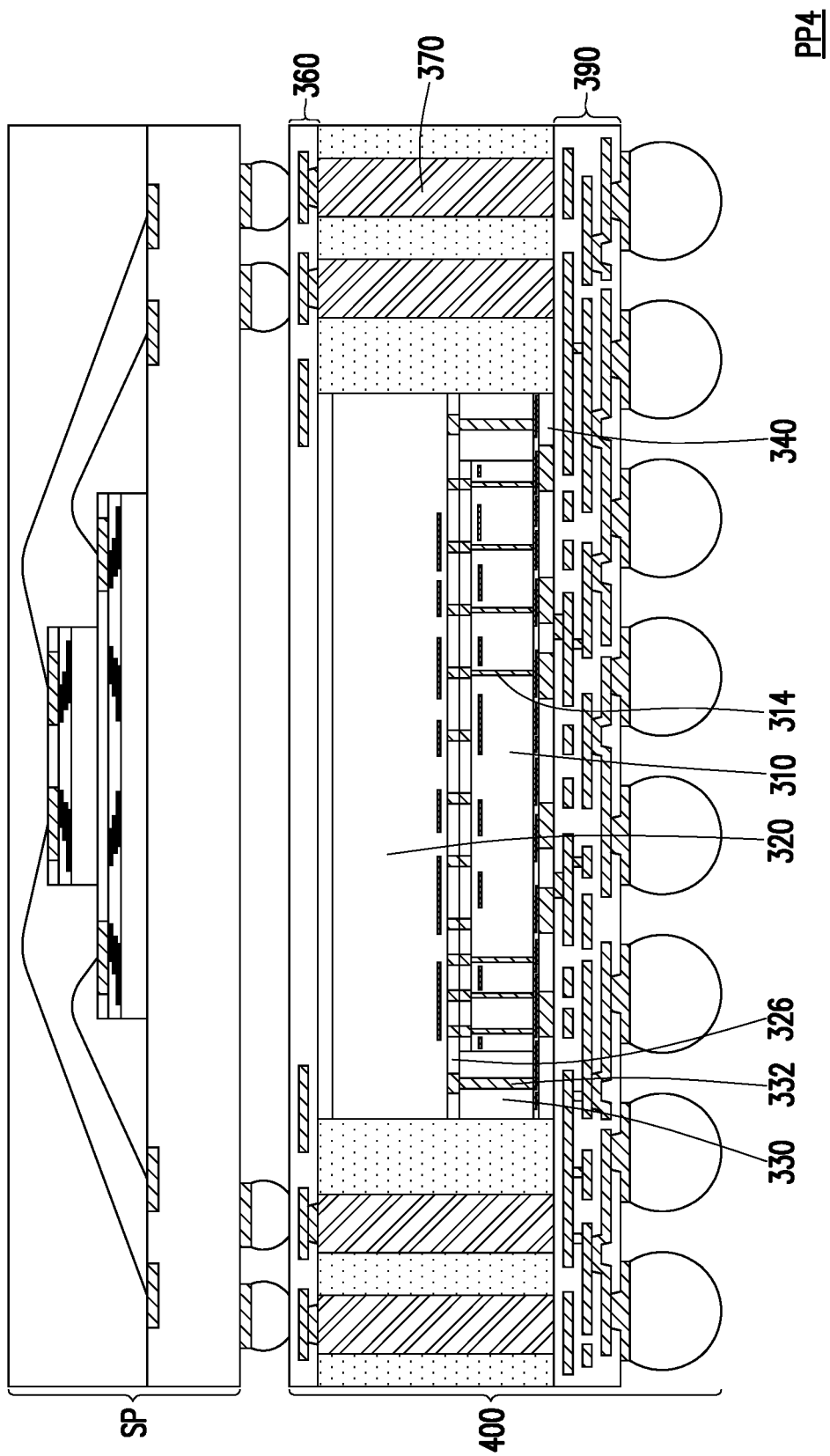
FIG. 5 schematically illustrates a package structure in accordance with some embodiments of the disclosure.

FIG. 5 schematically illustrates a package structure in accordance with some embodiments of the disclosure. A package structure PP4 includes a semiconductor package 400 and a semiconductor package SP. The semiconductor package 400 is connected to the semiconductor package SP that is similar to the semiconductor package SP shown in FIG. 3K to form the package structure PP4, e.g. a package on package (PoP) structure. In the embodiment, the semiconductor package 400 is similar to the semiconductor package 300 shown in FIG. 3K, but further includes a micro through insulation via 332 formed in the lateral fill 330. Specifically, the semiconductor package 400 includes the first semiconductor die 310, the second semiconductor die 320, the lateral fill 330, the redistribution circuit structure 360, the through insulation via 370, the insulating encapsulation 380 and the redistribution circuit structure 390 that are described in FIG. 3K and further includes the micro through insulation via 332.

The semiconductor package 400 is fabricated by performing the steps of FIG. 3A to FIG. 3J with a micro via formation step performed between the step of FIG. 3B and the step FIG. 3C. For example, referring to FIG. 3B, a micro via structure (corresponding to the micro through insulation via 332 in FIG. 5) is formed on the interconnect circuit structure 326 beside the semiconductor grain 310'. Subsequently, the lateral fill 330' is formed to encapsulate the micro via structure in the step of FIG. 3C, and the micro via structure is grinded in the step of FIG. 3D to form the micro through insulation via 332 in FIG. 5. The micro through insulation via 332 passes through the lateral fill 330 in the thickness direction and physically and electrically connected to the interconnect circuit structure 318 of the first semiconductor die 310 and the interconnect circuit structure 326 of the second semiconductor die 320 so that the micro through insulation via 332 also establishes an electric transmission path between the first semiconductor die 310 and the second semiconductor die 320. The micro through insulation via 332 has a larger diameter than the through silicon via 314 formed in the first semiconductor die 310 and may provide an electric transmission path with less resistance.

FIG. 6A to FIG. 6M schematically illustrate a method of fabricating a semiconductor package in accordance with some embodiments of the disclosure. A semiconductor grain 510' that is cut from a first semiconductor wafer (not shown) is bonded to a carrier substrate 502 through a bonding film 504. Each of the semiconductor grain 510' includes a semiconductor substrate 512', through silicon via structures 514', and circuit components 516. The semiconductor substrate 512' may be a semiconductor substrate such as a silicon substrate. The circuit components 516 include active components (e.g., transistors or the like) and passive components (e.g., resistors, capacitors, inductors, or the like) formed in the semiconductor substrate 512', for example adjacent to a front side 510F of the semiconductor grain 510'. The active components and passive components are formed through front end of line (FEOL) fabrication processes of a semiconductor wafer. The through silicon via structures 514' are formed in the semiconductor substrate 512' and each extends from the surface adjacent to the front side 510F into a certain depth of the semiconductor substrate 512' without passing through the semiconductor substrate 512' in the thickness direction. In the following steps, the semiconductor grain 510' would be processed to form a first semiconductor die for a semiconductor package.

Figure 6A:
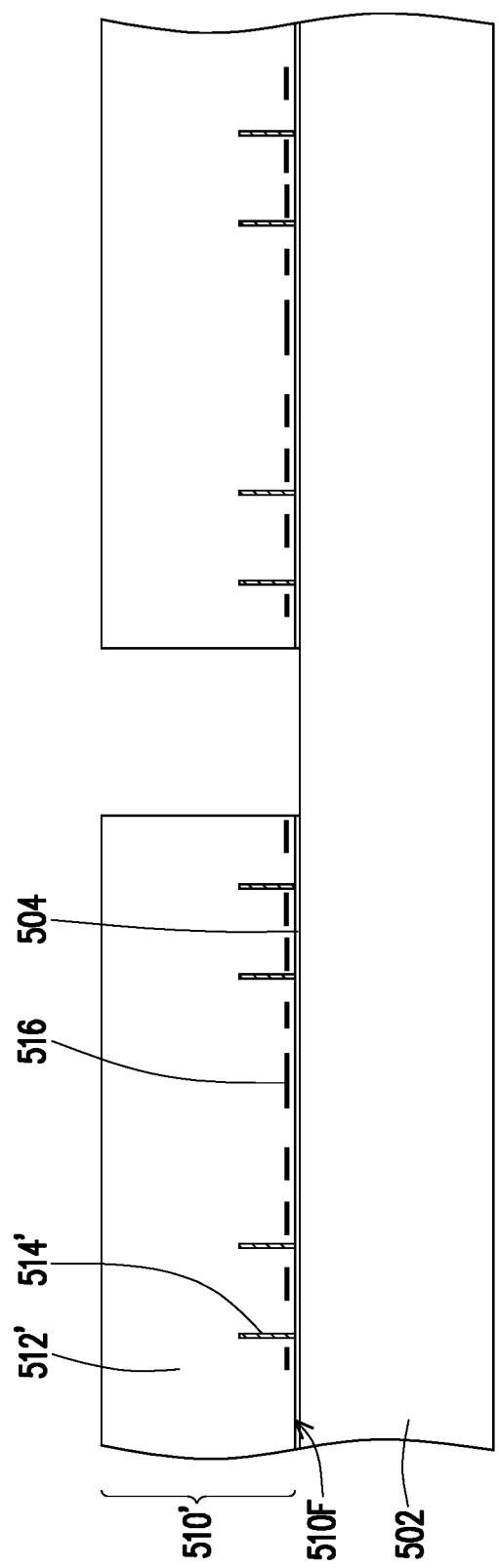
FIG. 6A to FIG. 6M are cross-sectional views schematically illustrating a method of fabricating a semiconductor package in accordance with some embodiments of the disclosure.
Figure 6B:
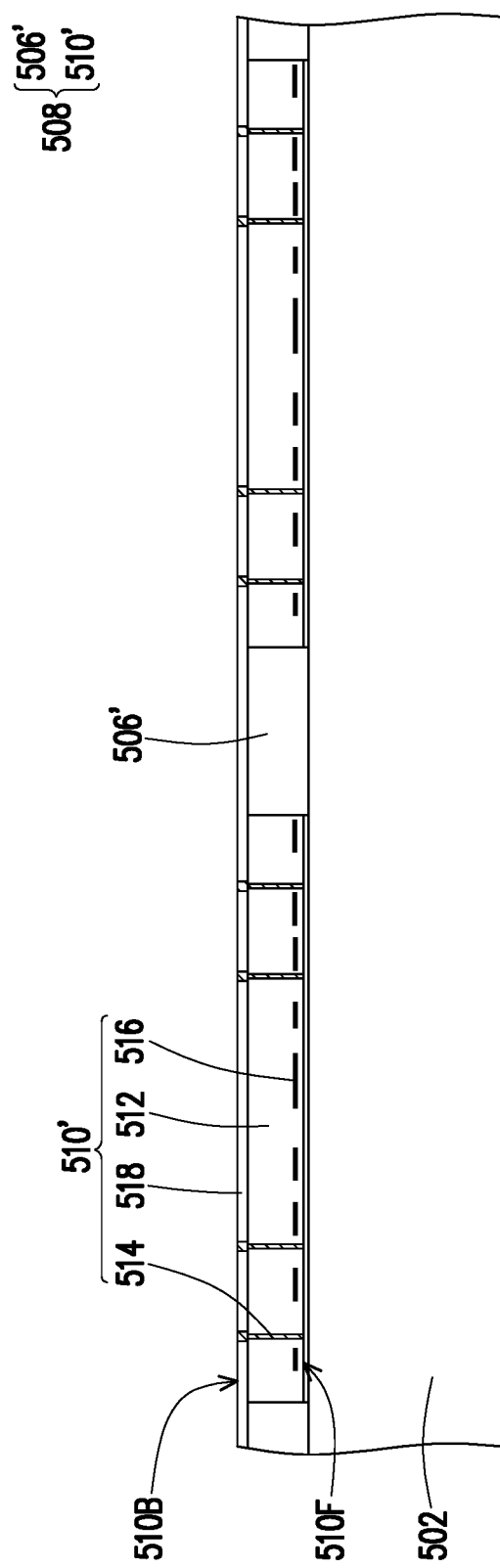

In FIG. 6B, a gap fill material 506' is formed between the semiconductor grains 510' so that several semiconductor substrates 512 are connected by the gap fill material 506' to form a wafer structure 508 on the carrier substrate 502. In some embodiments, the material of the gap fill material 506' includes oxide material, glass material or other suitable dielectric material. For example, the material of the gap fill material 506' may be undoped silicate glass (USG), phospho silicate glass (PSG), tetra ethyl-ortho-silicate (TEOS), or similar material. In addition, as shown in FIG. 6B, a reveal process for TSVs (through silicon vias) is performed on the wafer structure 508 so that through silicon vias 514 are formed from the through silicon via structures 514' and an interconnect circuit structure 518 is disposed on the semiconductor substrate 512 over the through silicon via 514 at the back side 510B of the semiconductor grain 510'. Each through silicon via 514 passes through the semiconductor substrate 512 in the thickness direction. The interconnect circuit structure 518 may include at least one interconnect wiring layer (e.g., copper interconnect wiring) and at least one dielectric layer stacked alternately, and is physically and electrically connected to the through silicon vias 514. The interconnect circuit structure 518 and the gap fill material 506' are coplanar at the back side 510B to form the wafer structure 508.

Figure 6C:
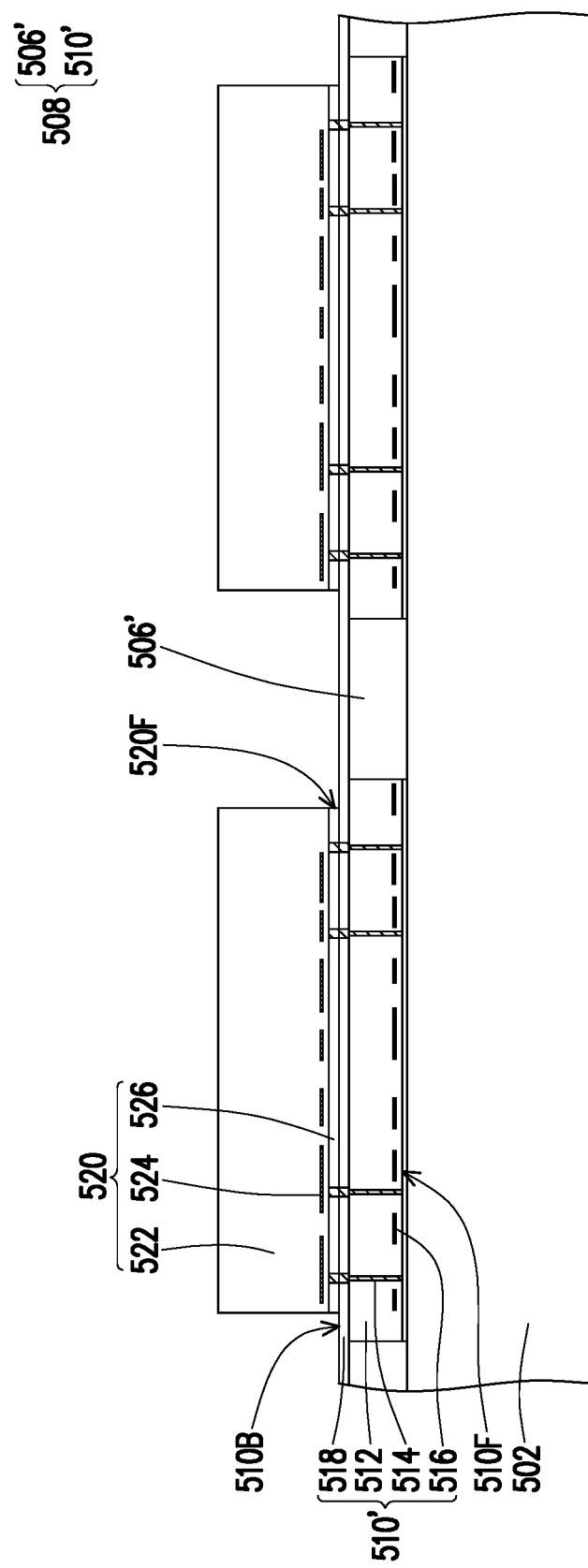

In FIG. 6C, a second semiconductor die 520 is bonded onto the semiconductor substrate 512 of the wafer structure 508 through a hybrid-bonding process. The second semiconductor die 520 is formed from another semiconductor wafer (a second semiconductor wafer) and includes a semiconductor substrate 522, circuit components 524 and an interconnection circuit structure 526. The semiconductor substrate 522 is, for example, a silicon substrate. The circuit components 524 include active components (e.g., transistors or the like) and passive components (e.g., resistors, capacitors, inductors, or the like) formed through front end of line (FEOL) fabrication processes of a semiconductor wafer. The circuit components 524 are formed on the semiconductor substrate 522 adjacent to the front side 520F of the second semiconductor die 520. The interconnect circuit structure 526 is disposed on the semiconductor substrate 522 at the front side 520F of the second semiconductor die 520 and is electrically connected to the circuit components 524.

The front side 520F of the second semiconductor die 520 faces the semiconductor substrate 512. The front side 510F of the semiconductor substrate 512 faces the carrier substrate 502 and the back side 510B of the semiconductor substrate 512 faces the second semiconductor die 520. The interconnect circuit structure 526 at the front side 520F of the second semiconductor die 520 is in direct contact with the interconnect circuit structure 518 at the back side 510B of the semiconductor grain 510'. In the embodiment, the outermost conductive wiring layer in the interconnect circuit structure 526 is connected to the outermost conductive wiring layer in the interconnect circuit structure 518 physically and electrically, and the outermost dielectric layer in the interconnect circuit structure 526 is connected to the outermost dielectric layer in the interconnect circuit structure 518 physically, which forms the hybrid-bonding connection.

Figure 6D:
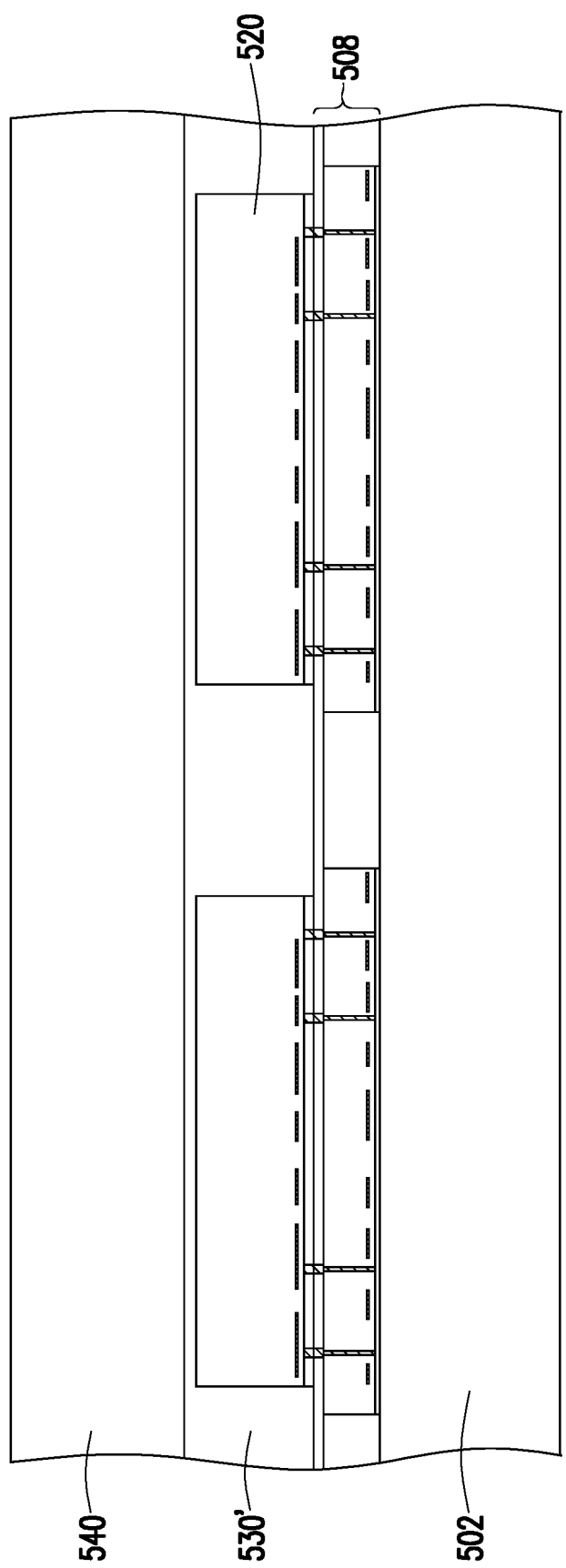

In FIG. 6D, a temporary glue material 530' is formed on a carrier substrate 540 in advance and the carrier substrate 540 is bonded onto the wafer structure 508 through the temporary glue material 530'. The second semiconductor die 520 is located between the wafer structure 508 and the carrier substrate 540. An amount of the temporary glue material 530' is sufficient to completely fill the gap between the carrier substrate 540 and the wafer structure 508. The temporary glue material 530' may laterally surround the second semiconductor die 520 and extend between the second semiconductor die 520 and the carrier substrate 540. In some embodiments, the carrier substrate 540 is bonded onto the wafer structure 508 through a thermal pressing process in a wafer form to wafer form manner.

The temporary glue material 530' is a glue material capable of being removed in the subsequent steps. The temporary glue material 530' is solidified after attaching the carrier substrate 540 to the wafer structure 508. The temporary glue material 530' may have sufficient mechanical property without leaking, and/or deforming in the subsequent steps. In some embodiments, the temporary glue material 530' may be removed by a suitable cleaner such as a neutral detergent/cleaner so that the removing of the temporary glue material in the subsequent steps would not damage other components or materials. The carrier substrate 540 may include a glass substrate having sufficient support property and rigidity. In some embodiments, the carrier substrate 540 may include a releasing layer formed between the temporary glue material 530' and the glass substrate so that the glass substrate may be able to release from the temporary glue material 530'.

Figure 6E:
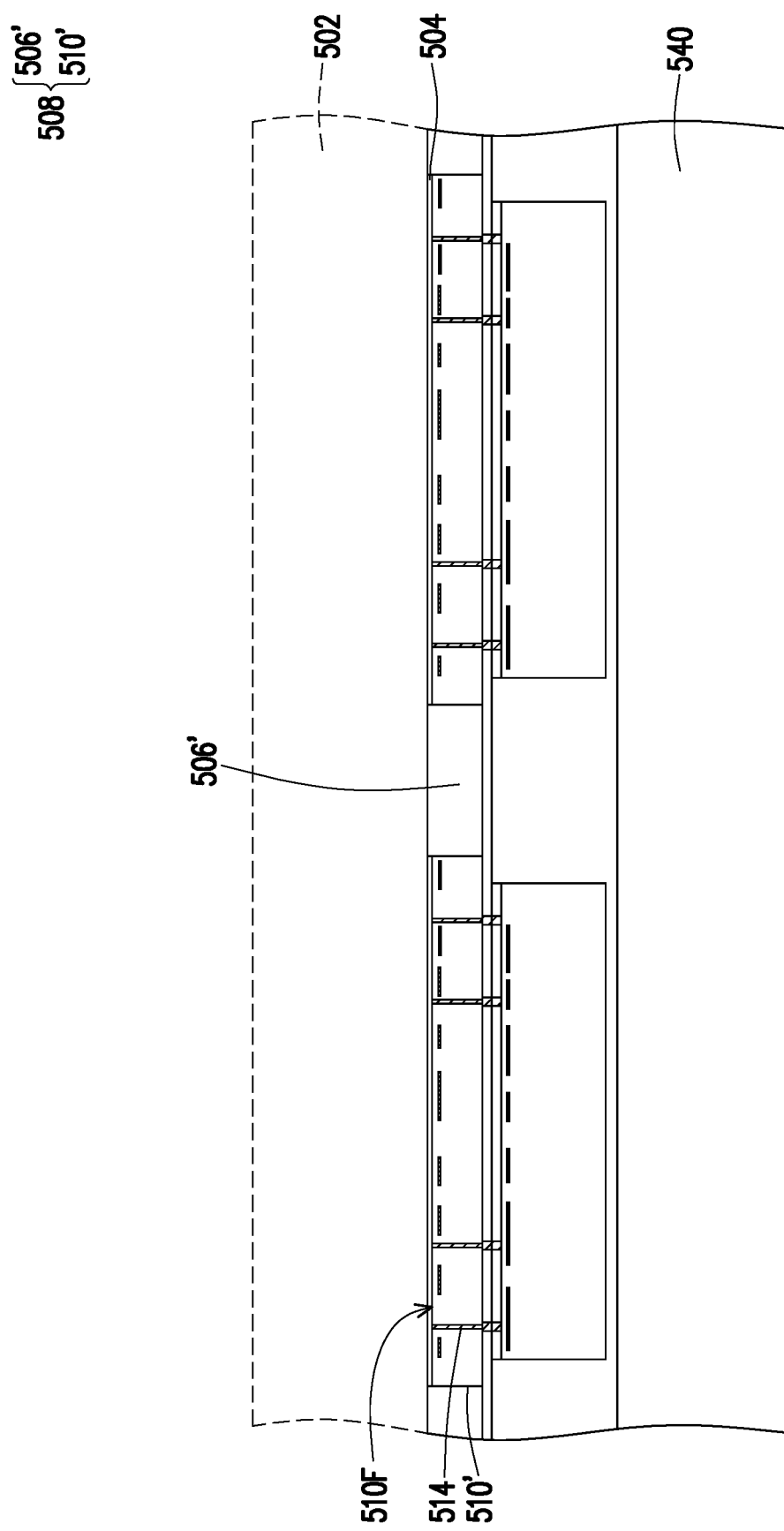

In FIG. 6E, the structure of FIG. 6D is oriented upside down so that the wafer structure 508 is located above the carrier substrate 540. The carrier substrate 502 is removed as shown in FIG. 6E by a grinding process until the bonding film 504 is exposed. Subsequently, the bonding film 504 is also removed to expose the through silicon via 514 at the front side 510F of the semiconductor grain 510'.

Figure 6F:
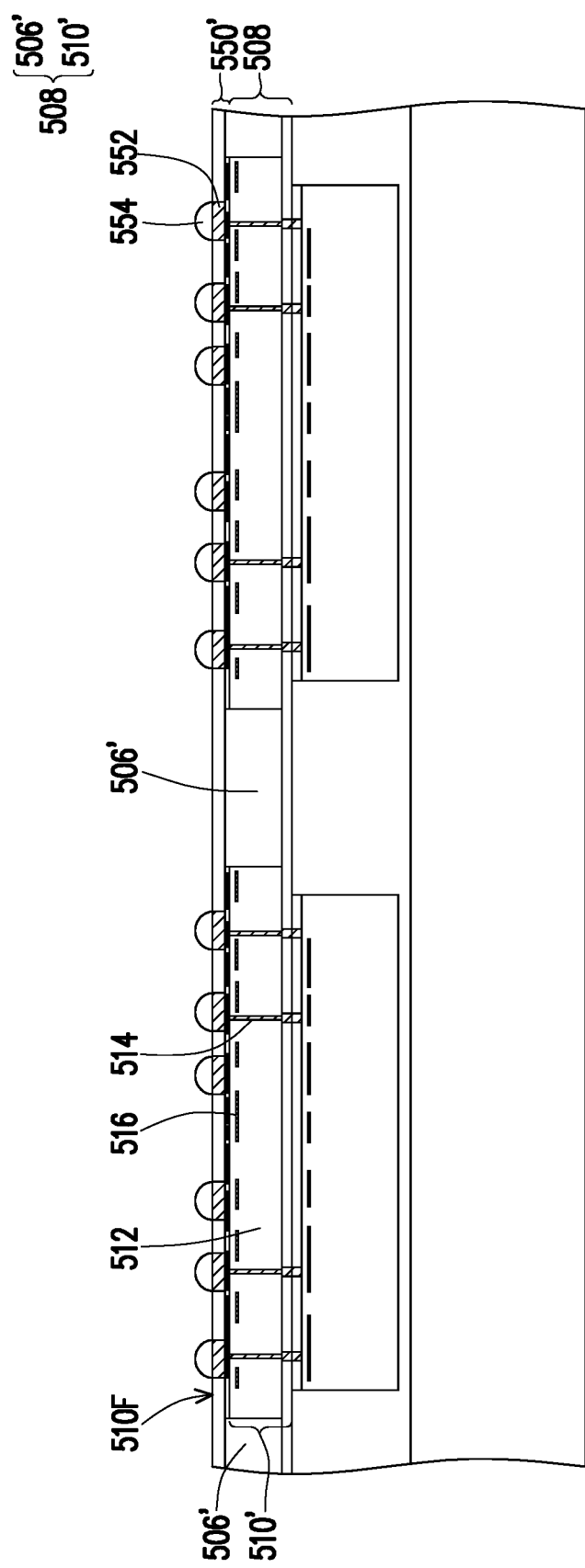

In FIG. 6F, an interconnect circuit structure 550' is formed on the wafer structure 508 at the front side 510F of the semiconductor grain 510'. The interconnect circuit structure 550' continuously extend over the semiconductor grain 510' and the gap fill material 506'. The interconnect circuit structure 550' may include interconnect wiring layers (e.g., copper interconnect wirings) and dielectric layers stacked alternately. The interconnect wiring layers of the interconnect circuit structure 550' are electrically connected to the circuit components 516 and the through silicon vias 514 formed in the semiconductor substrate 512.

A conductive feature 552 is formed on the outermost wiring layer of the interconnect circuit structure 550' and a cap material 554 is formed on top of the conductive feature 552. The conductive feature 552 may be a cupper via, a liner cupper via, or the like. In some embodiments, the conductive feature 552 is formed of a metal material such as cupper and electrically connect to the conductive wiring layers in the interconnect circuit structure 550'. The cap material 554 is optionally formed by using solder material. The conductive feature 552 with the cap material 554 on top serves as a testing pad for an electric test. For example, a wafer-level chip probing process may be performed on the semiconductor grains 510' using the conductive feature 552 with the cap material 554, such that tested and reliable known good dies (KGDs) may be recognized. In some embodiments, the conductive feature 552 may not be covered by the cap material 554.

Figure 6G:
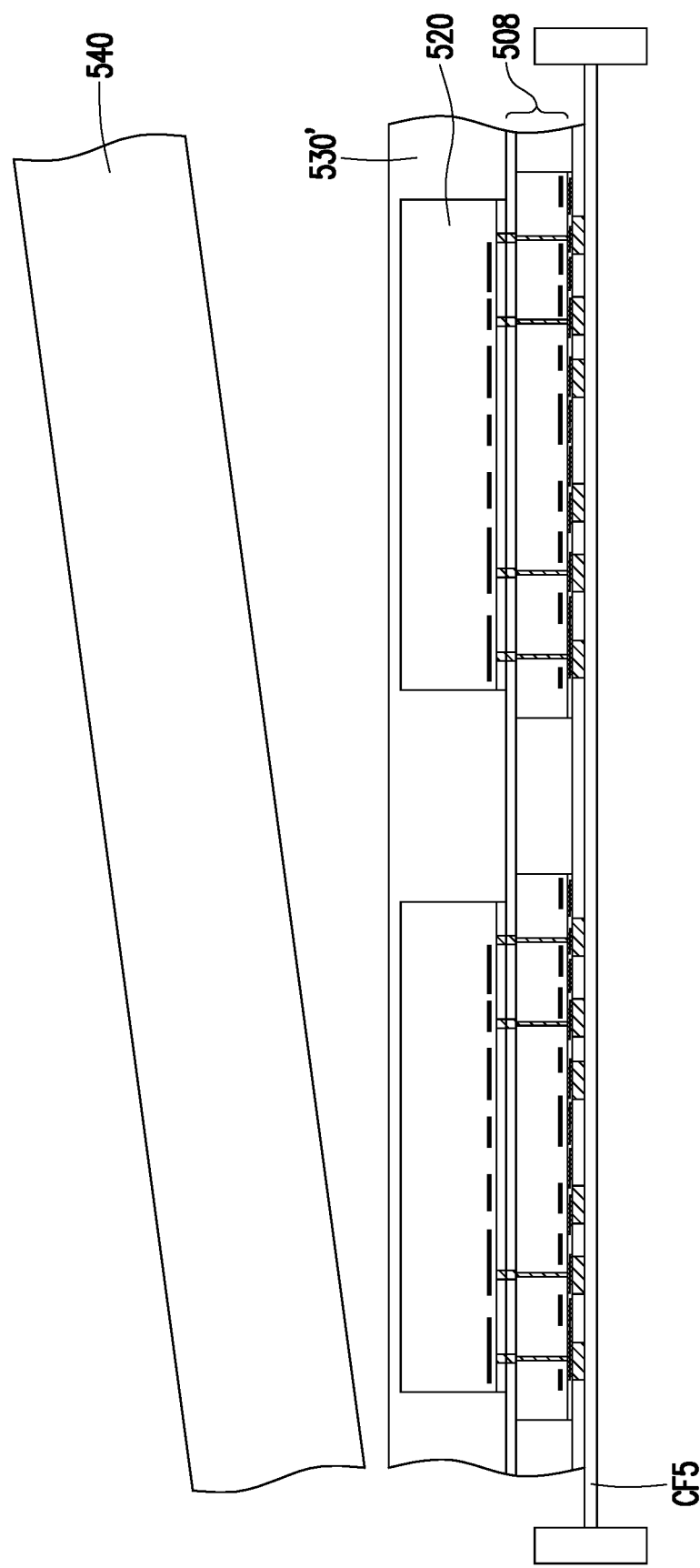
Figure 6H:
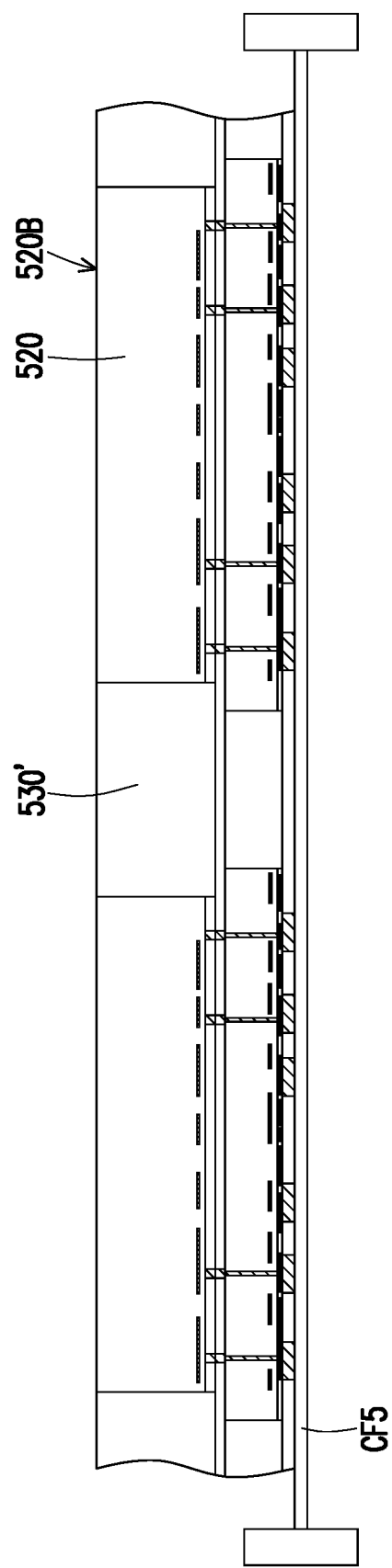

After performing the wafer-level chip probing process, the cap material 554 is removed through an etching process and the structure of FIG. 6F is oriented upside down and placed on carrier frame CF5 as shown in FIG. 6G. The wafer structure 508 is located between the carrier frame CF5 and the second semiconductor die 520. In addition, the carrier substrate 540 is separated from the temporary glue material 530'. Subsequently, a grinding process is performed to remove a portion of the temporary glue material 530' until the second semiconductor die 520 is thinned to have a desired thickness as shown in FIG. 6H. The temporary glue material 530' and the second semiconductor die 520 are coplanar at the back side 520B of the second semiconductor die 520. Thereafter, in FIG. 6I, the structure of FIG. 6H is oriented upside down and transferred onto a carrier frame CF6. The second semiconductor die 520 is positioned between the wafer structure 508 and the carrier frame CF6. The interconnect circuit structure 550' faces upwards. In addition, a die attach film AF is formed between the carrier frame CF6 and the second semiconductor dies 520 as well as between the carrier frame CF6 and the temporary glue material 530'.

Figure 6I:
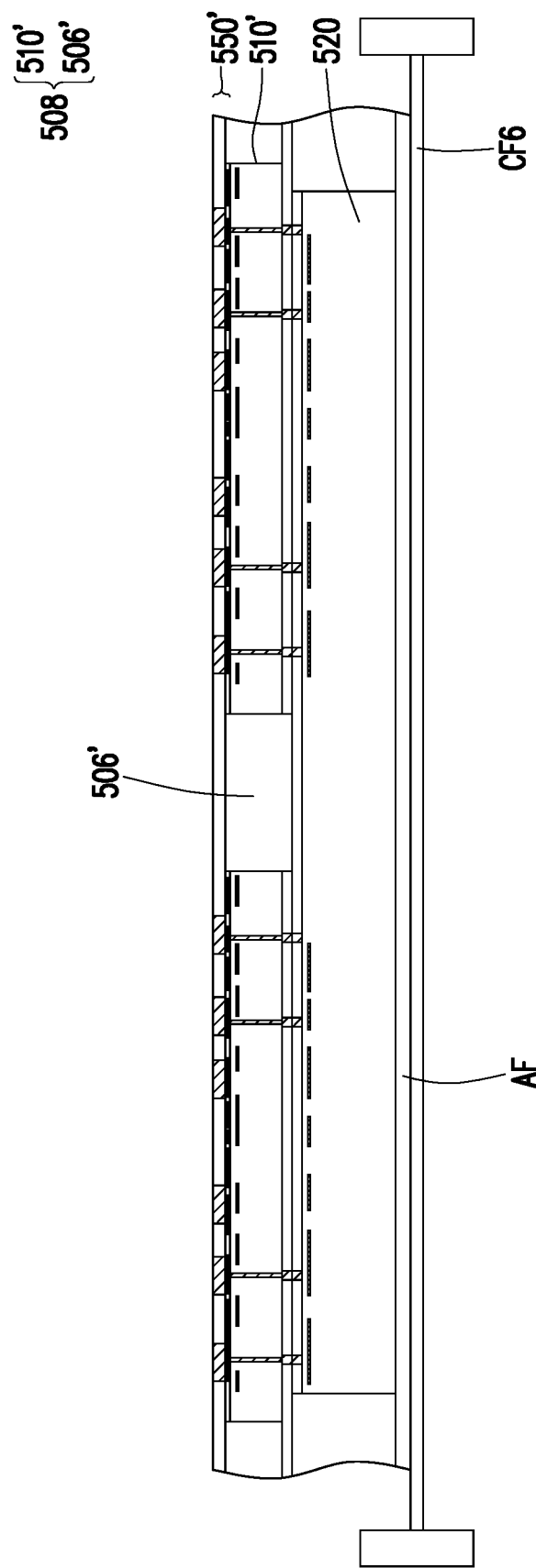
Figure 6J:
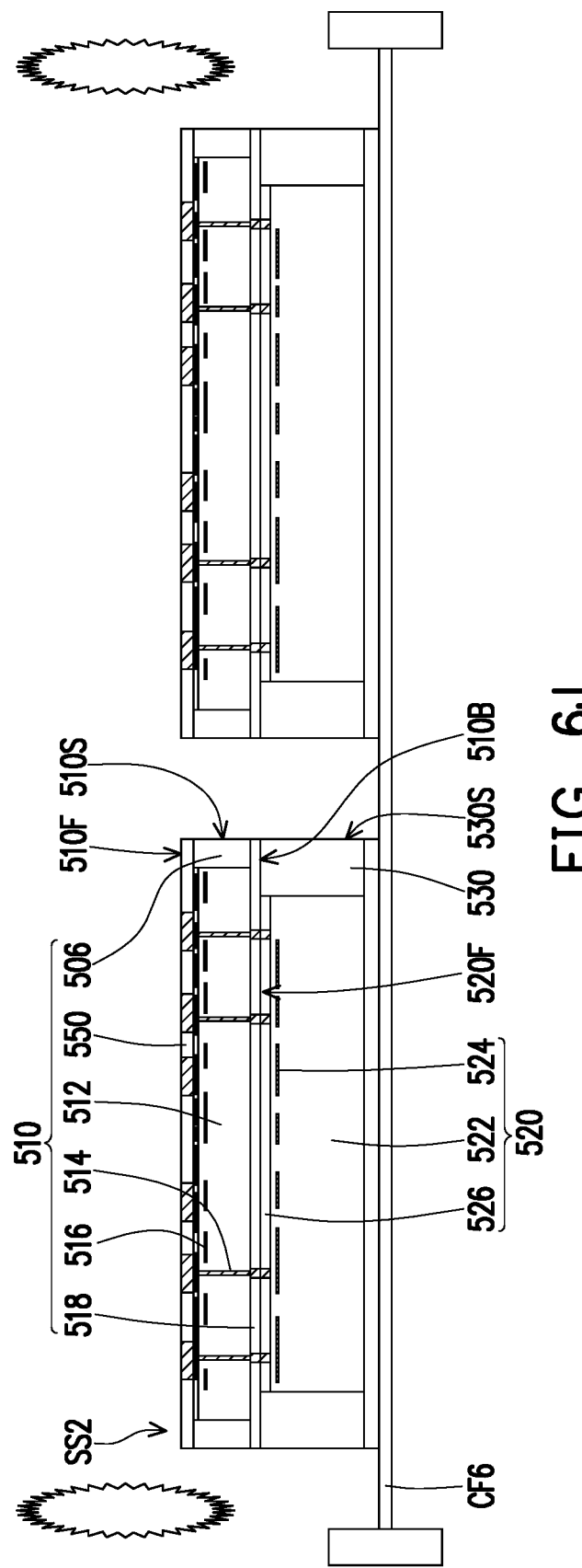

In FIG. 6J, a singulation process is performed to from singulated structures SS2. Each of the singulated structures SS2 includes a first semiconductor die 510, a second semiconductor die 520 and a lateral fill 530. The front side 510F of the first semiconductor die 510 and the front side 520F of the second semiconductor die 520 both face upwards, away from the carrier frame CF6 in FIG. 6J. The first semiconductor die 510 has a lateral dimension greater than the second semiconductor die 520. The first semiconductor die 510 and the second semiconductor die 520 are stacked with each other in the thickness direction while the first semiconductor die 510 exceeds the second semiconductor die in the lateral direction. The lateral fill 530 is disposed beside the second semiconductor die 520 in the lateral direction and overlaps with the first semiconductor die 510 in the thickness direction.

The first semiconductor die 510 includes a semiconductor substrate 512, a through silicon via 514, circuit components 516, an interconnect circuit structure 518, another interconnect circuit structure 550' and a peripheral fill 506. The semiconductor substrate 512 is a silicon substrate. The through silicon via 514 is embedded in the semiconductor substrate 512 and passes through the semiconductor substrate 512 in the thickness direction. The circuit components 516 are disposed on/in the semiconductor substrate 512 at the front side 510F of the first semiconductor die 510. The interconnect circuit structure 518 is disposed on the semiconductor substrate 512 at the back side 510B of the first semiconductor die 510. The interconnect circuit structure 550 is disposed on the semiconductor substrate 512 at the front side 510F of the first semiconductor die 510. The interconnect circuit structure 518 and the interconnect circuit structure 550 exceed the semiconductor substrate 512 in the lateral direction. The peripheral fill 506 surrounds the semiconductor substrate 512 and is disposed between the interconnect circuit structure 518 and the interconnect circuit structure 550. The peripheral fill 506 is formed by cutting the gap fill material 506' shown in FIGS. 6B to 6I. The peripheral fill 506 is made of the dielectric material such as oxide.

The second semiconductor die 520 includes a semiconductor substrate 522, circuit components 524 and an interconnect circuit structure 526. The circuit components 524 are disposed in/on the semiconductor substrate 522 at the front side 520F of the second semiconductor die 520. The interconnect circuit structure 526 is disposed on the semiconductor substrate 522 at the front side 520F and is electrically connected to the circuit components 524. The interconnect circuit structure 526 of the second semiconductor die 520 is in direct contact with the interconnect circuit structure 518 formed at the back side 510B of the first semiconductor die 510. The second semiconductor die 520 is connected to the first semiconductor die 510 in a front side to back side manner. The second semiconductor die 520 is smaller than the first semiconductor die 510 in the lateral direction and thus a portion of the interconnect circuit structure 518 of the first semiconductor die 510 is not structurally connected to the second semiconductor die 520.

The lateral fill 530 is formed by cutting the temporary glue material 530' shown in FIG. 6I. The material of the lateral fill 530 is a glue material that is removable in the subsequent process. The lateral fill 530 compensates the dimension difference between the first semiconductor die 510 and the second semiconductor die 520 in the lateral direction. In some embodiments, the sidewall 530S of the lateral fill 530 is aligned with the sidewall 510S of the first semiconductor die 510 in a smooth or straight linear trace so that the singulated structure SS2 may have a smooth or straight linear sidewall.

Figure 6K:
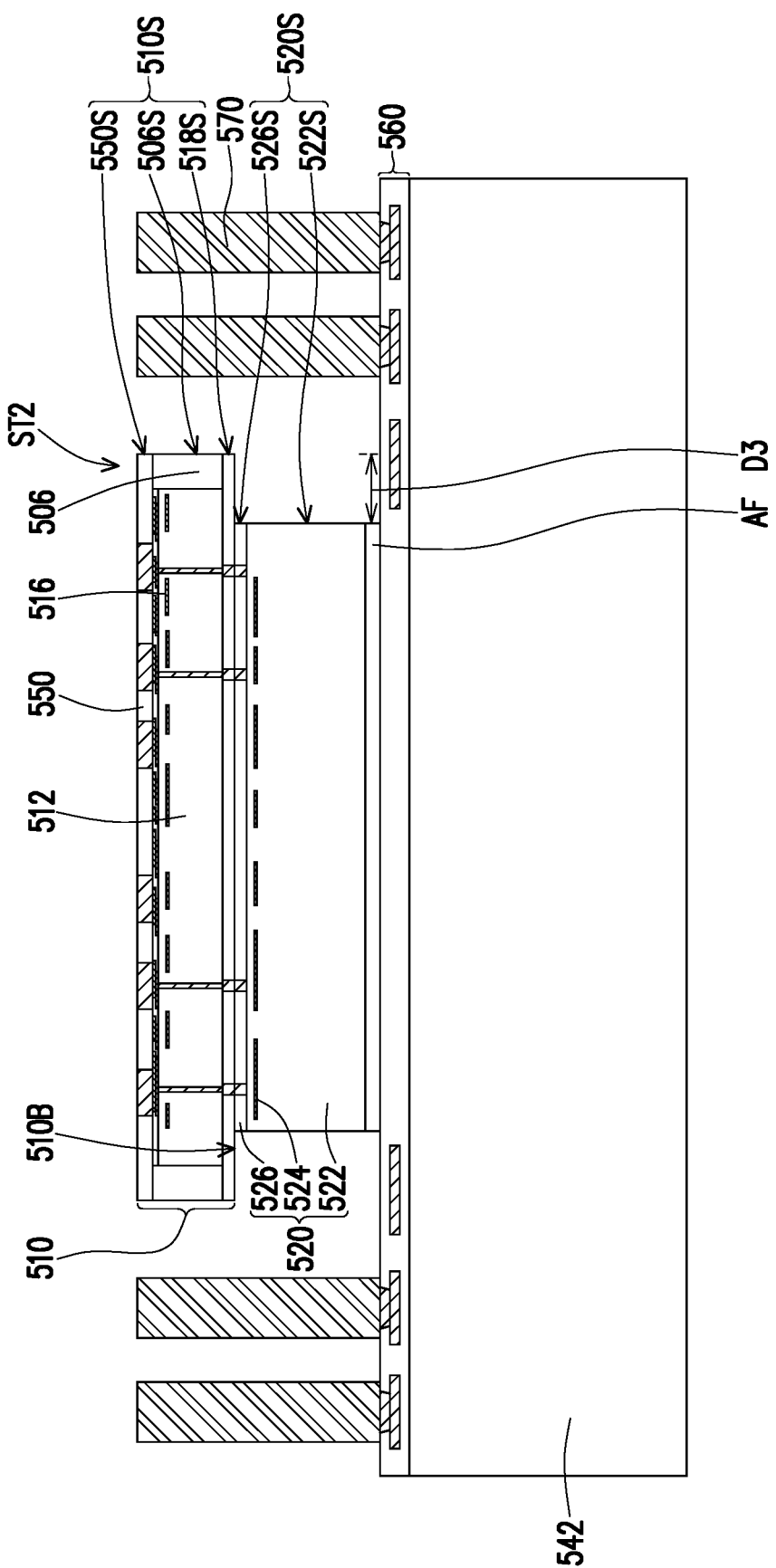

The singulated structure SS2 is picked and placed on a carrier substrate 542 and a clean process is performed to remove the lateral fill 530 to form a stair structure ST2 as shown in FIG. 6K. The stair structure ST2 is attached to the carrier substrate 542 through the die attach film AF. The second semiconductor die 520 is located between the first semiconductor die 510 and the carrier substrate 542 in the thickness direction. In the embodiment, a redistribution circuit structure 560 and a through insulation via 570 are formed on the carrier substrate 542 prior to attaching the stair structure ST2 onto the carrier substrate 542. The second semiconductor die 520 is attached onto the redistribution circuit structure 560 and the through insulation via 570 is positioned beside the stair structure ST2. The through insulation via 570 is electrically connected to the redistribution circuit structure 560 and there is not electric connection path formed between the semiconductor substrate 522 and the redistribution circuit structure 560 since the die attach film AF is a dielectric attach film.

In the first semiconductor die 510, the sidewall 550S of the interconnect circuit structure 550, the sidewall 506S of the peripheral fill 506 and the sidewall 518S of the interconnect circuit structure 518 are exposed at the sidewall 510S of the first semiconductor die 510. The semiconductor substrate 512 of the first semiconductor die 510 is laterally covered by the peripheral fill 506 and are not exposed at the sidewall 510S. The first semiconductor die 510 laterally exceeds the second semiconductor die 520 located at the back side 510B of the first semiconductor die 510, and a portion of the interconnect circuit structure 518 is exposed at the back side 510B of the first semiconductor die 510 without overlapping the second semiconductor die 520.

In the second semiconductor die 520, the sidewall 526S of the interconnect circuit structure 526 and the sidewall 522S of the semiconductor substrate 522 are exposed at the sidewall 520S of the second semiconductor die 520. The sidewall 520S and the sidewall 510S are spaced from each other by a lateral distance D3 due to the lateral dimension difference between the first semiconductor die 510 and the second semiconductor die 520. A portion of the first semiconductor die 510 extending between the sidewall 510S and the sidewall 520S does not overlap the second semiconductor die 520 in the thickness direction.

Figure 6L:
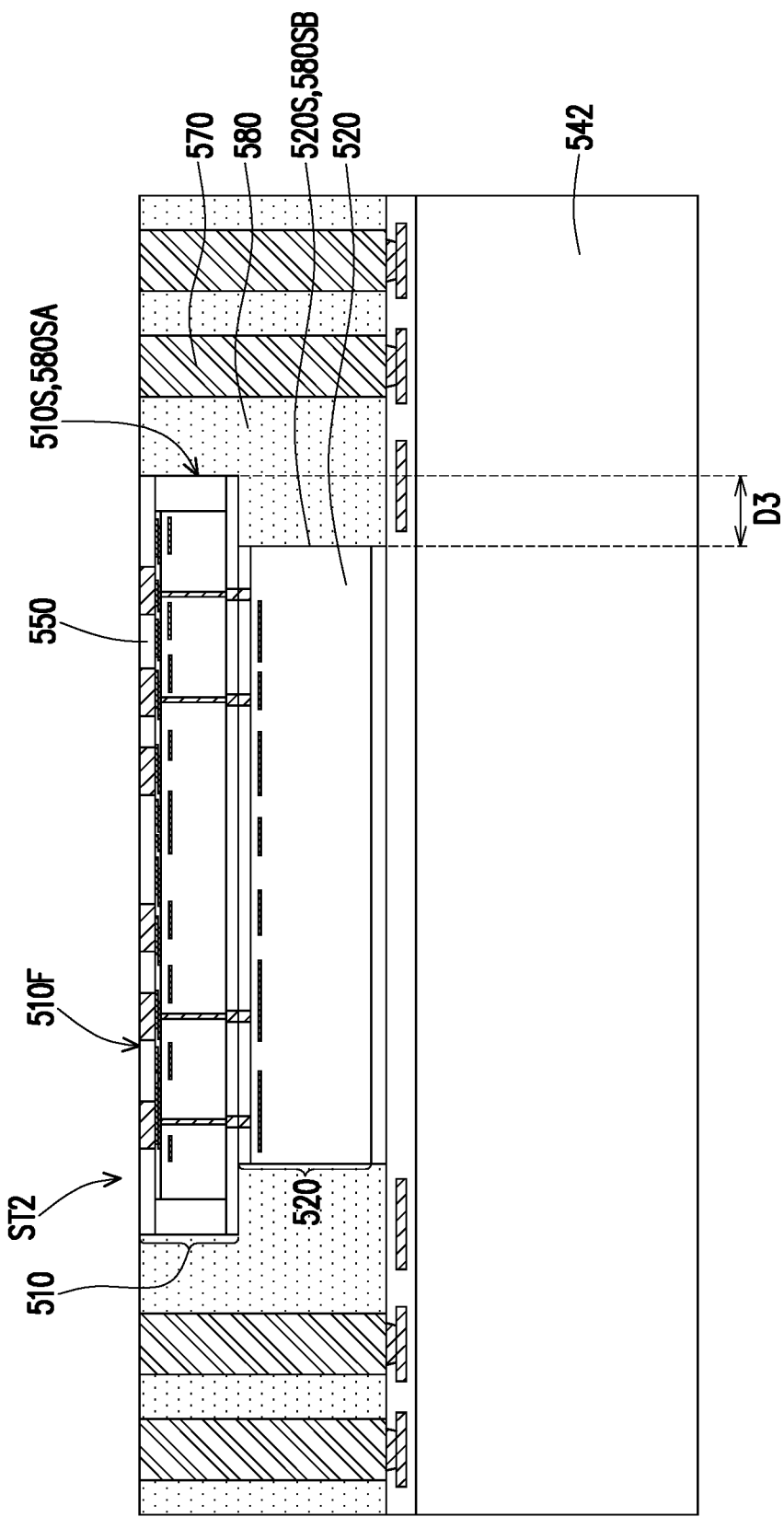

In FIG. 6L, an insulating encapsulation 580 is formed on the carrier substrate 542 and laterally encapsulates the stair structure ST2. The insulating encapsulation 580 fills the gap between the stair structure ST2 and the through insulation via 570. The through insulation via 570 extends through the insulating encapsulation 580 in the thickness direction. The insulating encapsulation 580 is similar to the insulating encapsulation 180 described in the previous embodiment and the details for the insulating encapsulation 180 may be incorporated to the present embodiment. The insulating encapsulation 580 surrounds the stair structure ST2 and exposes the first semiconductor die 510 at the front side 510F of the first semiconductor die 510. The interconnect circuit structure 550 of the first semiconductor die 510, the insulating encapsulation 580 and the through insulation via 570 are coplanar at the front side 510F of the first semiconductor die 510.

The insulating encapsulation 580 laterally surrounds and encapsulates the stair structure ST2 in a one-piece form. The insulating encapsulation 580 has a first sidewall 580SA in direct contact with the first semiconductor die 510 and a second sidewall 580SB in direct contact with the second semiconductor die 520. The sidewall 510S of the first semiconductor die 510 may coincide with the first sidewall 580SA of the insulating encapsulation 580. The sidewall 520S of the second semiconductor die 520 may coincide with the second sidewall 580SB of the insulating encapsulation 580. The first sidewall 580SA keeps a lateral distance D3 from the second sidewall 580SB.

Figure 6M:
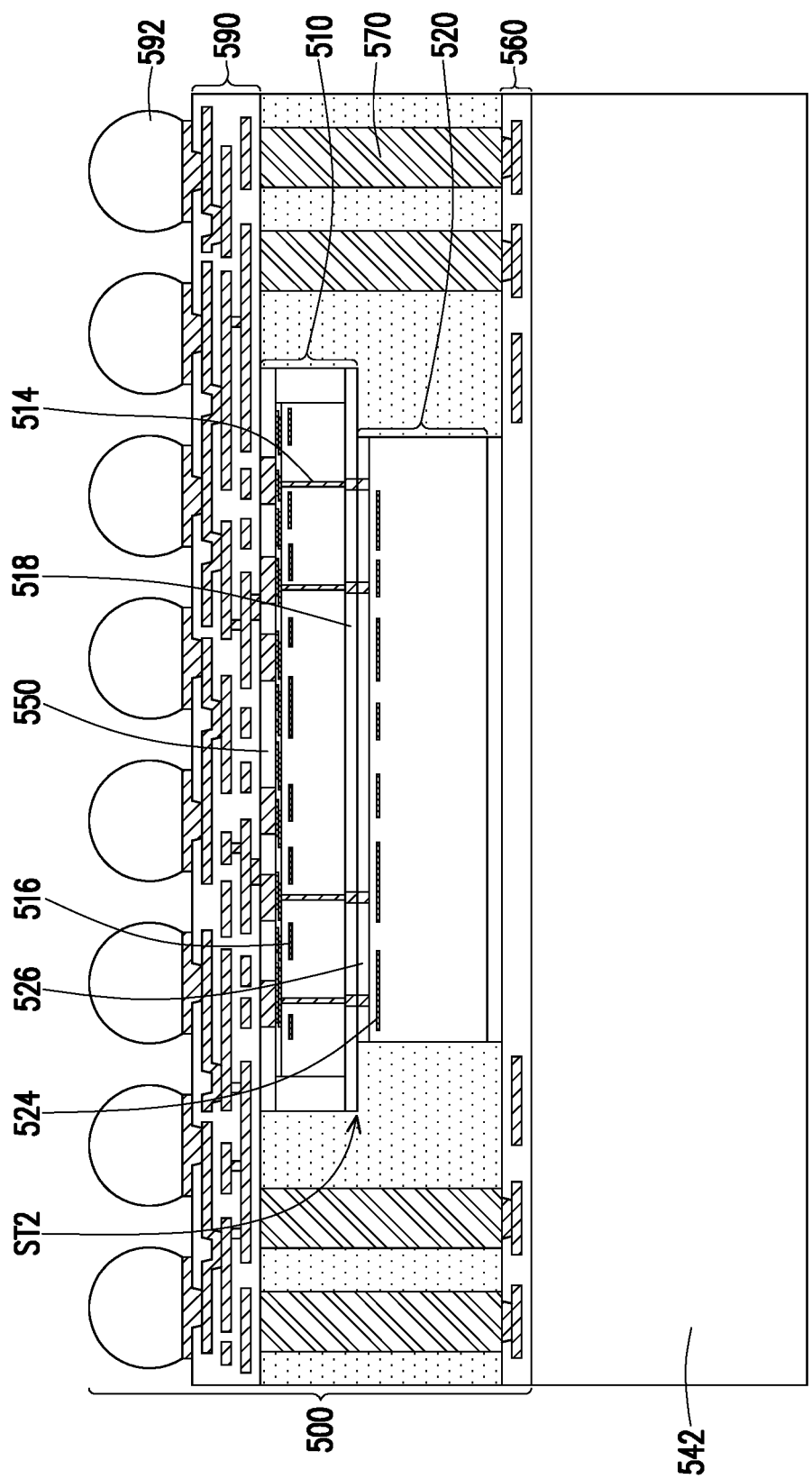

In FIG. 6M, another redistribution circuit structure 590 is formed on the first semiconductor die 510 of the stair structure ST2, the through insulation via 570 and the insulating encapsulation 580, and conductive terminal 592 is formed on the redistribution circuit structure 590 to form a semiconductor package 500 on the carrier substrate 542. The redistribution circuit structure 590 and the conductive terminals 592 are similar to the redistribution circuit structure 190 and the conductive terminals 792 described in the previous embodiment and the details of the redistribution circuit structure 190 and the conductive terminals 592 are applicable to the present embodiment.

The redistribution circuit structure 590 is electrically connected to the through insulation via 570 and the first semiconductor die 510. In addition, the interconnect circuit structure 526 formed in the second semiconductor die 520 is electrically connected to the interconnect circuit structure 518 formed in the first semiconductor die 510, and the interconnect circuit structure 518 is electrically connected to the interconnect circuit structure 550 through the through silicon via 514 formed in the first semiconductor die 510. Accordingly, the second semiconductor die 520 is electrically connected to the redistribution circuit structure 590 through the first semiconductor die 510. In the embodiments, the through silicon vias 514 formed in the first semiconductor die 510 provide electric transmission paths for the electric signals of the circuit components 524 in the second semiconductor die 520 while the electric signals of the circuit components 516 in the first semiconductor die 510 are not transmitted through the through silicon via 514. The quantity and the distribution density of the through silicon vias 514 may be reduced.

Figure 6N:
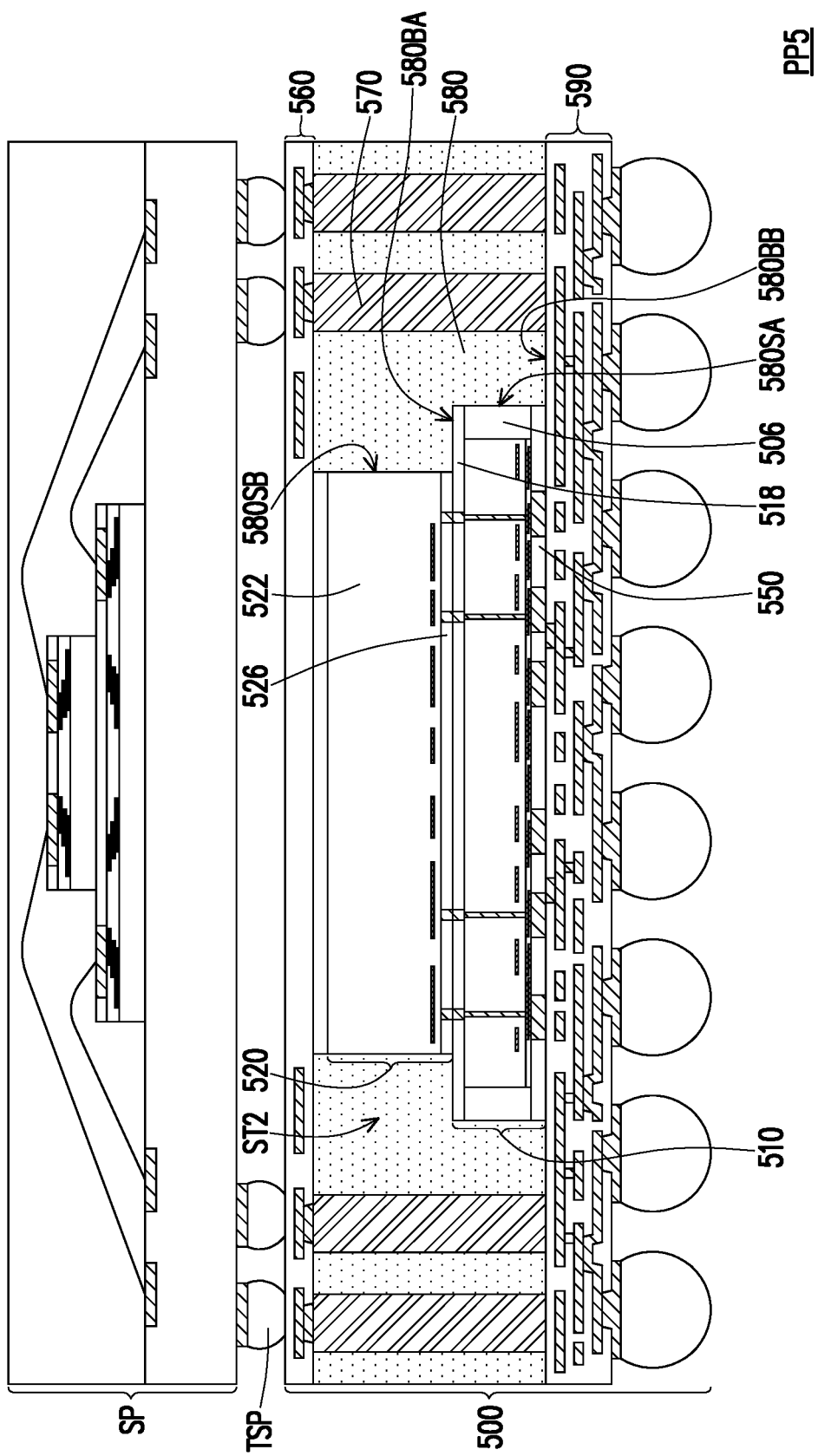
FIG. 6N schematically illustrates a package structure in accordance with some embodiments of the disclosure.

FIG. 6N schematically illustrates a package structure in accordance with some embodiments of the disclosure. The semiconductor package 500 is separated from the carrier substrate 542 (shown in FIG. 6M) and connected to another semiconductor package SP to construct a package structure PP5. The package structure PP5 is a package-on-package (PoP) structure which includes two or more semiconductor packages stacking with one another. A conductive terminal TSP is provided at a side of the semiconductor package SP and mounted onto the semiconductor package 500. In some embodiments, the semiconductor package SP is a DRAM package, and the semiconductor package 500 is a logic package. In addition, the conductive terminal TSP includes solder balls. The conductive terminal TSP may be mounted on the redistribution circuit structure 560. The semiconductor package SP and the conductive terminal 590 are located at opposite sides of the semiconductor package 500.

The semiconductor package 500 in the package structure PP5 includes a first semiconductor die 510, a second semiconductor die 520, a redistribution circuit structure 560, a through insulation via 570, an insulating encapsulation 580 and a redistribution circuit structure 590. The second semiconductor die 520 is stacked on the first semiconductor die 510 that has a greater lateral dimension than the second semiconductor die 520 to form a stair structure ST2. The insulating encapsulation 580 laterally encapsulates and surrounds the stair structure ST2 in a one-piece form. The one-piece insulating encapsulation 580 is in direct contact with the interconnect circuit structure 518, the interconnect circuit structure 550 and the peripheral fill 506 of the first semiconductor die 510 at the sidewall 580SA, in direct contact with the semiconductor substrate 522 and the interconnect circuit structure 526 of the second semiconductor die 520 at the sidewall 580SB, in direct contact with the interconnect circuit structure 518 of the first semiconductor die 510 at the bottom surface 580BA, and in direct contact with the redistribution circuit structure 590 at the bottom surface 580BB. The sidewall 580SB, the bottom surface 580BA, the sidewall 580SA and the bottom surface 580BB of the insulating encapsulation 580 form a stair-like surface.

Figure 7:
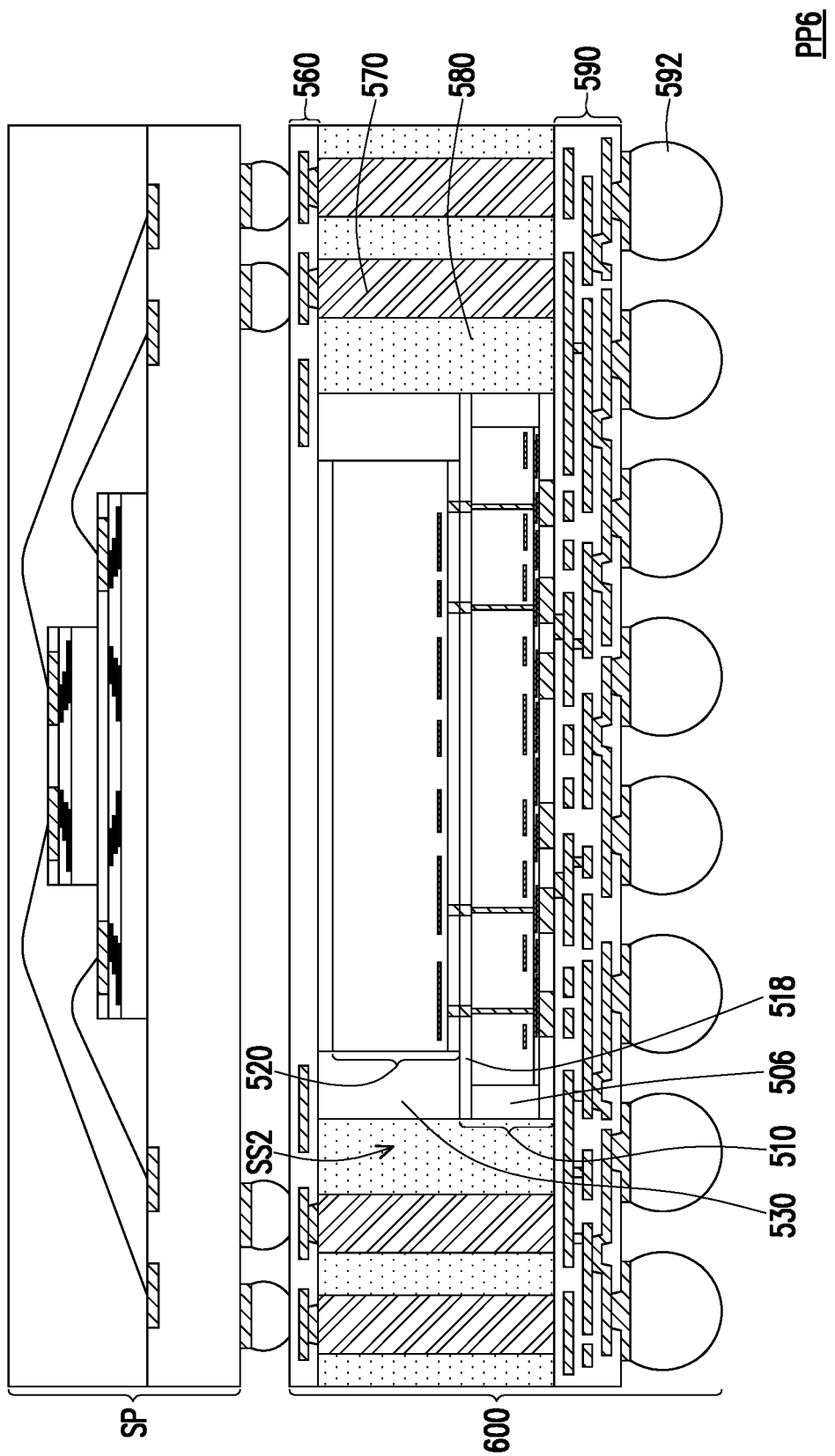
FIG. 7 schematically illustrates a package structure in accordance with some embodiments of the disclosure.

In FIG. 7, a semiconductor package 600 is connected to another semiconductor package SP that is similar to the semiconductor package SP shown in FIG. 6N to form a package structure PP6 that is a package on package (PoP) structure. The package structure PP6 of FIG. 7 is different from the package structure PP5 of FIG. 6N in the structure of the semiconductor package 600. Specifically, the semiconductor package 600 includes a first semiconductor die 510, a second semiconductor die 520, an insulating encapsulation 580, a redistribution circuit structure 560, a redistribution circuit structure 590 with the conductive terminal 592, through insulation vias 570 and a lateral fill 530. The semiconductor package 600 is similar to the semiconductor package 500 but further has the lateral fill 530 that is removed in the semiconductor package 500. The semiconductor package 600 may be fabricated by performing the steps of FIGS. 6A to 6M while the clean process in the step of FIG. 6K is omitted so that the lateral fill 530 remains in the semiconductor package 600. The details for the first semiconductor die 510, the second semiconductor die 520, the redistribution circuit structure 560, the redistribution circuit structure 590 with the conductive terminal 592, and the through insulation vias 570 may refer to the precious description for the semiconductor package 500 without reiterating here.

In the semiconductor package 600, the insulating encapsulation 580 is in direct contact with the lateral fill 530 without contacting the second semiconductor die 520. In other words, the lateral fill 530 is disposed between the second semiconductor die 520 and the insulating encapsulation 580. The lateral fill 530 overlaps a portion of the first semiconductor die 510 and is in direct contact with a portion of the interconnect circuit structure 518 in the first semiconductor die 510. The lateral fill 530 compensates the dimension difference between the first semiconductor die 510 and the second semiconductor die 520 in the lateral direction. Accordingly, the one-piece insulating encapsulation 580 may have a substantially vertical sidewall in contact with the singulated structure SS2 formed by the first semiconductor die 510, the second semiconductor die 520 and the lateral fill 530.

Figure 8:
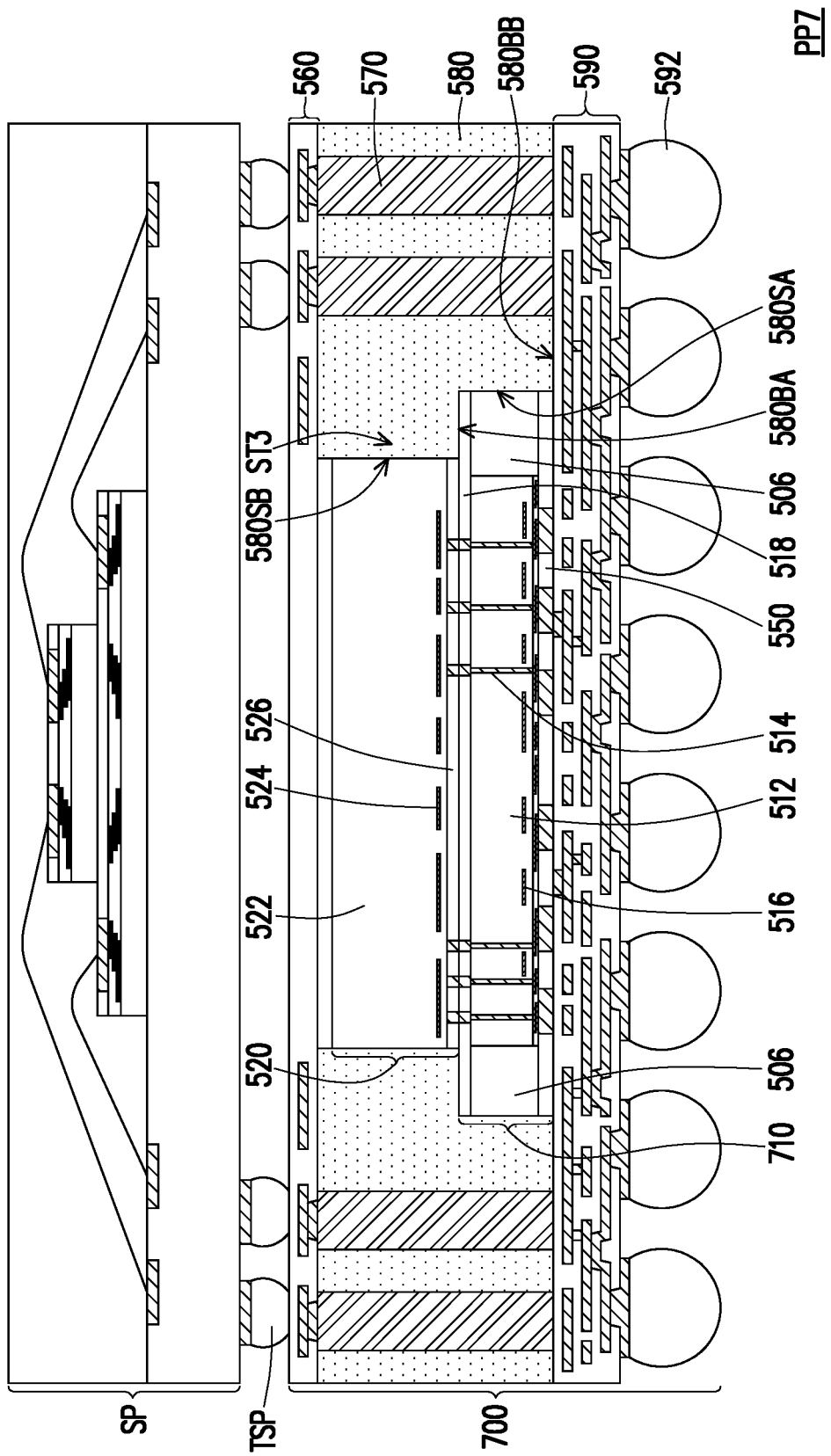
FIG. 8 schematically illustrates a package structure in accordance with some embodiments of the disclosure.

In FIG. 8, a semiconductor package 700 is connected to another semiconductor package SP that is similar to the semiconductor package SP shown in FIG. 6N to form a package structure PP7 that is a package on package (PoP) structure. The package structure PP7 of FIG. 8 is different from the package structure PP5 of FIG. 6N in the structure of the semiconductor package 700. Specifically, the semiconductor package 700 includes a first semiconductor die 710, a second semiconductor die 520, an insulating encapsulation 580, a redistribution circuit structure 560, a redistribution circuit structure 590 with the conductive terminal 592, and through insulation vias 570. The semiconductor package 700 is similar to the semiconductor package 500 but the first semiconductor die 710 in the semiconductor package 700 is different from the first semiconductor die 510 in the semiconductor package 500. The semiconductor package 700 may be fabricated by performing the steps of FIGS. 6A to 6M and the details for the second semiconductor die 520, the redistribution circuit structure 560, the redistribution circuit structure 590 with the conductive terminal 592, and the through insulation vias 570 may refer to the precious description for the semiconductor package 500 without reiterating here.

In the embodiment, the first semiconductor die 710, similar to the first semiconductor die 510, includes semiconductor substrate 512, through silicon vias 514, circuit components 516, an interconnect circuit structure 518, a peripheral fill 506 and another interconnect circuit structure 550. The semiconductor substrate 512 has a lateral dimension smaller than the second semiconductor die 520. A portion of the interconnect circuit structure 518 exceeds the semiconductor substrate 512 and in contact with the interconnect circuit structure 526 of the second semiconductor die 520.

The second semiconductor die 520 is stacked with the first semiconductor die 510 to form a stair structure ST3. The insulating encapsulation 580 is in direct contact with the semiconductor substrate 522 and the interconnect circuit structure 526 of the second semiconductor die 520 at the sidewall 580SA, in direct contact with the interconnect circuit structure 518 of the first semiconductor die 510 at the bottom surface 580BA, in direct contact with the interconnect circuit structure 518, the peripheral fill 506 and the interconnect circuit structure 550 at the sidewall 580SB, and in direct contact with the redistribution circuit structure 590 at the bottom surface 580BB. The portions of the insulating encapsulation 580 forming the sidewall 580SA, the bottom surface 580SA, the sidewall 580SB, and the bottom surface 580BB are in one-piece form. There is no structural boundary in the insulating encapsulation 580 between the stair structure ST3 and the adjacent through insulation via 570.

Figure 9:
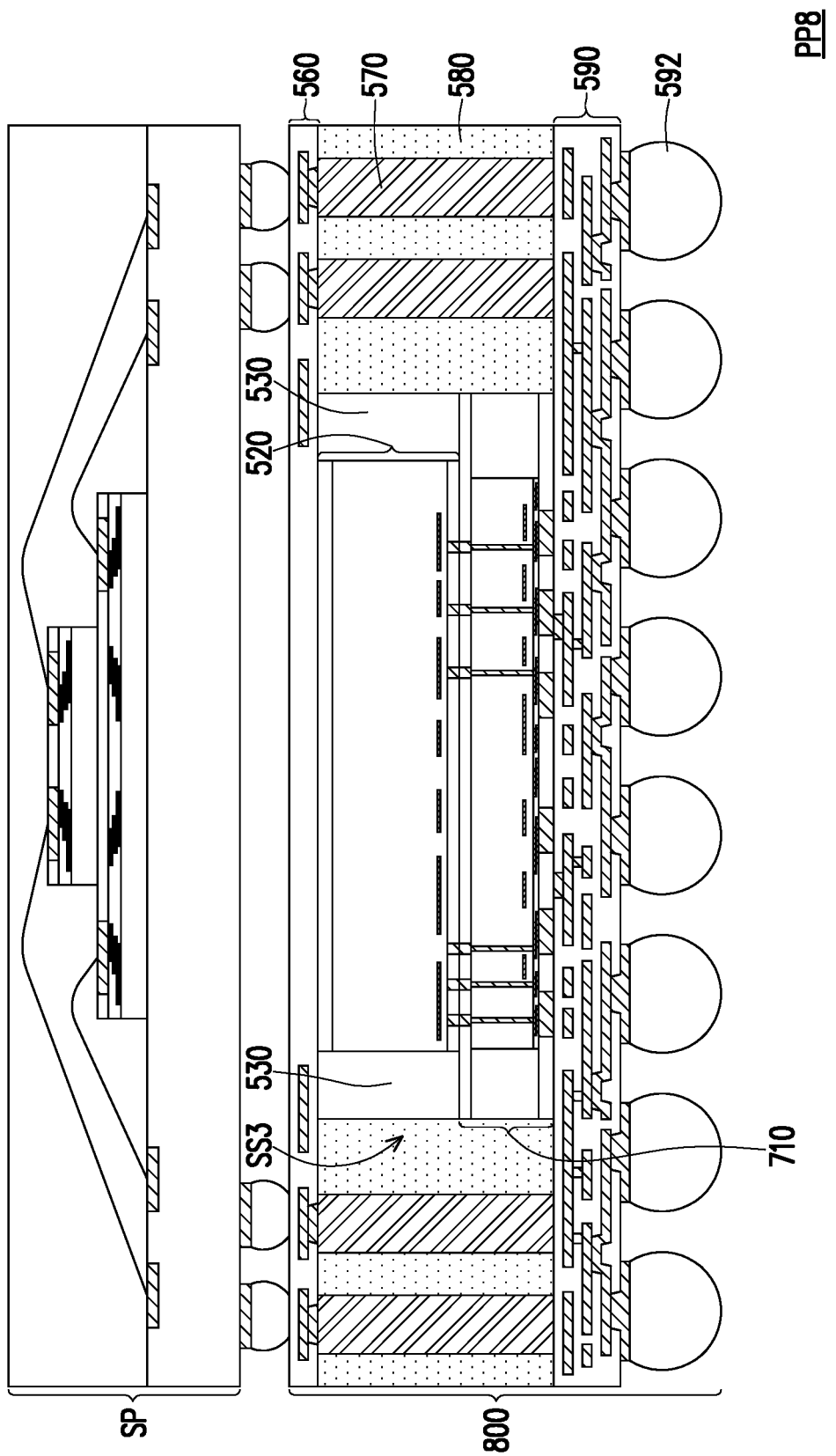
FIG. 9 schematically illustrates a package structure in accordance with some embodiments of the disclosure.

In FIG. 9, a semiconductor package 800 is connected to another semiconductor package SP that is similar to the semiconductor package SP shown in FIG. 8 to form a package structure PP8 that is a package on package (PoP) structure. The package structure PP8 of FIG. 9 is different from the package structure PP7 of FIG. 8 in the structure of the semiconductor package 800. Specifically, the semiconductor package 800 includes a first semiconductor die 710, a second semiconductor die 520, an insulating encapsulation 580, a redistribution circuit structure 560, a redistribution circuit structure 590 with the conductive terminal 592, through insulation vias 570 and a lateral fill 530. The semiconductor package 800 is similar to the semiconductor package 700 but further has the lateral fill 530. The semiconductor package 800 may be fabricated by performing the steps of FIGS. 6A to 6M while the clean process in the step of FIG. 6K is omitted so that the lateral fill 530 remains in the semiconductor package 800. The details for the first semiconductor die 710, the second semiconductor die 520, the redistribution circuit structure 560, the redistribution circuit structure 590 with the conductive terminal 592, and the through insulation vias 570 may refer to the precious description for the semiconductor package 700 without reiterating here.

In the semiconductor package 800, the insulating encapsulation 580 is in direct contact with the lateral fill 530 without contacting the second semiconductor die 520. In other words, the lateral fill 530 is disposed between the second semiconductor die 520 and the insulating encapsulation 580. The lateral fill 530 overlaps a portion of the first semiconductor die 710. The lateral fill 530 compensates the lateral dimension difference between the first semiconductor die 710 and the second semiconductor die 520 in the lateral direction. Accordingly, the one-piece insulating encapsulation 580 may have a substantially vertical sidewall in contact with the singulated structure SS3 formed by the first semiconductor die 710, the second semiconductor die 520 and the lateral fill 530.

The semiconductor package in accordance with some embodiments includes multiple semiconductor dies having different lateral dimensions. The semiconductor dies are stacked with each other and are laterally encapsulated by a one-piece insulating encapsulation. According, the fabrication method of the semiconductor package requires only one-time molding process, and thus the fabrication method is simplified and the fabrication time is saved. In some embodiments, the one-piece insulating encapsulation provides a uniformed material between the semiconductor die and the through insulation via and also between the through insulation vias, so that certain effects such as thermal conduction, stress distribution or the like may be more uniformed through the semiconductor package, which facilitates to ensure the property and the reliability of the semiconductor package or the package structure constructed by the semiconductor package.

In accordance with some embodiments of the disclosure, a semiconductor package includes a first semiconductor die, a second semiconductor die and an insulating encapsulation. The second semiconductor die is stacked on the first semiconductor die. The insulating encapsulation laterally surrounds the first semiconductor die and the second semiconductor die in a one-piece form, and has a first sidewall and a second sidewall respectively adjacent to the first semiconductor die and the second semiconductor die. The first sidewall keeps a lateral distance from the second sidewall. A portion of the insulating encapsulation between the first sidewall and the second sidewall overlaps one of the first semiconductor die and the second semiconductor die. A portion of the insulating encapsulation between the first sidewall and the second sidewall has a thinner thickness than another portion of the insulating encapsulation. The second semiconductor die is hybrid-bonded to the first semiconductor die. The first semiconductor die includes a semiconductor substrate in contact with the insulating encapsulation. The second semiconductor die includes a semiconductor substrate in contact with the insulating encapsulation. The insulating encapsulation has a first bottom surface extending between the first sidewall and the second sidewall and a second bottom surface connected to the first sidewall and extending away from the second sidewall. The first bottom surface keeps a vertical distance from the second bottom surface. The vertical distance is identical to a thickness of the first semiconductor die. The first semiconductor die has a lateral dimension greater than the second semiconductor die.

In accordance with some other embodiments of the disclosure, a semiconductor package includes a stair structure, an insulating encapsulation and a lateral fill. The stair structure includes a first semiconductor die and a second semiconductor die stacked on the first semiconductor die. The insulating encapsulation laterally surrounds the stair structure. The lateral fill is disposed between the insulating encapsulation and one of the first semiconductor die and the second semiconductor die. A material of the lateral fill is different from the insulating encapsulation. The lateral fill overlaps the other of the first semiconductor die and the second conductor die. The insulating encapsulation is in contact with the lateral fill and the other of the first semiconductor die and the second semiconductor die. A material of the lateral fill includes a temporary glue material. A material of the lateral fill includes polyimide.

In accordance with some other embodiments of the disclosure, a method of fabricating a semiconductor package including forming a first semiconductor die in a semiconductor wafer; bonding a second semiconductor die on the first semiconductor die, wherein a lateral dimension of the first semiconductor die is different from the second semiconductor die; forming a temporary glue material surrounding the second semiconductor die; singulating the first semiconductor die from the semiconductor wafer and cutting the temporary glue material; and laterally sealing the first semiconductor die and the second semiconductor die using an insulating encapsulation in a one-piece form, wherein a material of the insulating encapsulation is different from the temporary glue material. The temporary glue material is further removed before laterally sealing the first semiconductor die and the second semiconductor die using the insulating encapsulation. The temporary glue material attaches the second semiconductor die and the first semiconductor die to a carrier substrate prior to singulating the first semiconductor die from the semiconductor wafer. A reveal process of through silicon via is performed to form a through silicon via in the first semiconductor die. The carrier substrate is removed after the reveal process of through silicon. The temporary glue material is cut to from a lateral fill disposed between the second semiconductor die and the insulating encapsulation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a first redistribution circuit structure;
a second redistribution circuit structure, opposite to the first redistribution circuit structure;
a first semiconductor die disposed on the second redistribution circuit structure and comprising through silicon via structures;
a second semiconductor die stacked on the first semiconductor die in a front side to front side orientation, and the through silicon via structures of the first semiconductor die extending between the second semiconductor die and the second redistribution circuit structure, wherein a lateral dimension of the first semiconductor die is greater than a lateral dimension of the second semiconductor die and smaller than a lateral dimension of the second redistribution circuit structure;
a die attach film disposed between a passive surface of the second semiconductor die and the first redistribution circuit structure; and
an insulating encapsulation laterally surrounding the first semiconductor die and the second semiconductor die, and continuously covering a sidewall of the second semiconductor die and a portion of an active surface of the first semiconductor die.

2. The semiconductor package as claimed in claim 1, wherein the insulating encapsulation covers a sidewall of the die attach film.

3. The semiconductor package as claimed in claim 1, wherein the insulating encapsulation is in contact with the first redistribution circuit structure.

4. The semiconductor package as claimed in claim 1, wherein the second semiconductor die is bonded to the first semiconductor die in a metal to metal and insulation to insulation technique.

5. The semiconductor package as claimed in claim 1, wherein the first semiconductor die comprises a semiconductor substrate in contact with the insulating encapsulation.

6. The semiconductor package as claimed in claim 1, wherein the second semiconductor die comprises a semiconductor substrate in contact with the insulating encapsulation.

7. The semiconductor package as claimed in claim 1, wherein the insulating encapsulation has a first bottom surface extending along the active surface of the first semiconductor die and a second bottom surface extending away from the first semiconductor chip, and a sidewall of the first semiconductor die is connected between the first bottom surface and the second bottom surface.

8. The semiconductor package as claimed in claim 1, wherein the first semiconductor die comprises a semiconductor substrate and the through silicon via structures are embedded in the semiconductor substrate.

9. The semiconductor package as claimed in claim 1, further comprising a through insulation via embedded in the insulating encapsulation.

10. The semiconductor package as claimed in claim 1, wherein a lateral dimension of the die attach film is smaller than the lateral dimension of the first semiconductor die.

11. A semiconductor package comprising:
a first redistribution circuit structure;
a second redistribution circuit structure, opposite to the first redistribution circuit structure;
a stair structure disposed between the first redistribution circuit structure and the second redistribution circuit structure and comprising a first semiconductor die and a second semiconductor die stacked on the first semiconductor die in a front side to front side orientation, wherein the second semiconductor die is located between the first semiconductor die and the first redistribution circuit structure, the first semiconductor die comprises through silicon via structures extending between the second redistribution circuit structure and the second semiconductor die, and a lateral dimension of the first semiconductor die is greater than a lateral dimension of the second semiconductor die and smaller than a lateral dimension of the second redistribution circuit structure;
a die attach film, wherein a passive surface of the second semiconductor die is attached to the first redistribution circuit structure through the die attach film;
an insulating encapsulation laterally surrounding the stair structure; and
a lateral fill disposed between the insulating encapsulation and the second semiconductor die, wherein the lateral fill continuously covers a sidewall of the second semiconductor die and a portion of an active surface of the first semiconductor die and a material of the lateral fill is different from the insulating encapsulation.

12. The semiconductor package as claimed in claim 11, wherein a sidewall of the lateral fill is aligned with a sidewall of the first semiconductor die.

13. The semiconductor package as claimed in claim 11, wherein the insulating encapsulation is in contact with the lateral fill and the first semiconductor die.

14. The semiconductor package as claimed in claim 11, wherein a material of the lateral fill comprises a temporary glue material or polyimide.

15. The semiconductor package as claimed in claim 11, wherein a lateral dimension of the die attach film is smaller than the lateral dimension of the first semiconductor die.

16. A semiconductor package comprising:
a first semiconductor die comprising through silicon via structures;
a second semiconductor die, an entire of an active surface of the second semiconductor die being bonded on a first surface of the first semiconductor die;
a first redistribution circuit structure, a passive surface of the second semiconductor die being attached to the first redistribution circuit structure through a die attach film;
a second redistribution circuit structure, opposite to the first redistribution circuit structure, and the through silicon via structures of the first semiconductor die extending between the active surface of the second semiconductor die and the second redistribution circuit structure, wherein a lateral dimension of the first semiconductor die is greater than a lateral dimension of the second semiconductor die and smaller than a lateral dimension of the second redistribution circuit structure; and
an insulating encapsulation, laterally sealing the first semiconductor die, the second semiconductor die and the die attach film between the first redistribution circuit structure and the second redistribution circuit structure, wherein the insulating encapsulation covers the first surface of the first semiconductor die beside the second semiconductor die.

17. The semiconductor package as claimed in claim 16, wherein a lateral dimension of the die attach film is corresponding to the lateral dimension of the second semiconductor die, and a lateral dimension of the die attach film is smaller than the lateral dimension of the first semiconductor die.

18. The semiconductor package as claimed in claim 16, wherein the second redistribution circuit structure is disposed on a passive surface of the first semiconductor die and the insulating encapsulation.

19. The semiconductor package as claimed in claim 16, further comprising a through insulation via extending through the insulating encapsulation between the first redistribution circuit structure and the second redistribution circuit structure.

20. The semiconductor package as claimed in claim 16, wherein the first semiconductor die comprises a semiconductor substrate and a peripheral fill beside the semiconductor substrate, and the peripheral fill laterally extends exceeding the second semiconductor die.

* * * * *